United States Patent
Nakagawa

(10) Patent No.: US 9,222,775 B2
(45) Date of Patent: Dec. 29, 2015

(54) VIBRATOR ELEMENT, SENSOR UNIT, AND ELECTRONIC DEVICE

(71) Applicant: Seiko Epson Corporation, Tokyo (JP)

(72) Inventor: Keiji Nakagawa, Kamiina (JP)

(73) Assignee: Seiko Epson Corporation (JP)

(*) Notice: Subject to any disclaimer, the term of this patent is extended or adjusted under 35 U.S.C. 154(b) by 362 days.

(21) Appl. No.: 13/765,224

(22) Filed: Feb. 12, 2013

(65) Prior Publication Data
US 2013/0205898 A1    Aug. 15, 2013

(30) Foreign Application Priority Data

Feb. 14, 2012  (JP) ................................ 2012-029180
Mar. 9, 2012   (JP) ................................ 2012-052622

(51) Int. Cl.
*G01C 19/56*    (2012.01)
*G01C 19/5621*  (2012.01)
*H01L 41/047*   (2006.01)
*H01L 41/107*   (2006.01)

(52) U.S. Cl.
CPC ........ *G01C 19/5621* (2013.01); *H01L 41/0475* (2013.01); *H01L 41/107* (2013.01)

(58) Field of Classification Search
CPC .................................................. G01C 19/5621
USPC .......................................... 73/504.12, 504.16
See application file for complete search history.

(56) References Cited

U.S. PATENT DOCUMENTS

| | | |
|---|---|---|
| 4,930,351 A | 6/1990 | Macy et al. |
| 5,251,483 A | 10/1993 | Soderkvist |
| 5,343,749 A | 9/1994 | Macy |
| 5,522,249 A | 6/1996 | Macy |
| 5,585,562 A | 12/1996 | Kurata et al. |
| 5,635,642 A | 6/1997 | Nonomura et al. |
| 6,119,519 A | 9/2000 | Konno et al. |
| 6,253,613 B1 | 7/2001 | Yachi et al. |
| 6,327,908 B1 | 12/2001 | Yachi et al. |
| 6,666,091 B2 | 12/2003 | Hatanaka et al. |
| 7,207,221 B2 | 4/2007 | Kawauchi et al. |
| 7,975,545 B2 | 7/2011 | Noguchi et al. |
| 2004/0177690 A1 | 9/2004 | Kato |
| 2008/0105052 A1 | 5/2008 | Takahashi et al. |
| 2010/0064806 A1 | 3/2010 | Inaguma |
| 2012/0126664 A1 | 5/2012 | Ogura et al. |

FOREIGN PATENT DOCUMENTS

| | | |
|---|---|---|
| CN | 101173957 A | 5/2008 |
| CN | 101676729 A | 3/2010 |
| JP | 62-217115 A | 9/1987 |
| JP | 05-256723   | 10/1993 |
| JP | 08-327366   | 12/1996 |

(Continued)

*Primary Examiner* — John Chapman, Jr.
(74) *Attorney, Agent, or Firm* — Harness, Dickey & Pierce, P.L.C.

(57) ABSTRACT

A vibrator element includes a base section, a driving vibrating arm extending from one end of the base section, a detecting vibrating arm extending from another end of the base section opposite to the one end, an adjusting vibrating arm extending from the base section on an opposite side to the driving vibrating arm, and a support section extending from the base section and to be fixed to a substrate, and an output signal of the adjusting vibrating arm has a reverse phase with respect to an output signal of a leakage vibration of the detecting vibrating arm.

16 Claims, 15 Drawing Sheets

(56) References Cited

FOREIGN PATENT DOCUMENTS

| | | |
|---|---|---|
| JP | 10-019575 | 1/1998 |
| JP | 10-078326 | 3/1998 |
| JP | 11-063999 A | 3/1999 |
| JP | 2004-279101 A | 10/2004 |
| JP | 2006-054602 | 2/2006 |
| JP | 2006-189353 A | 7/2006 |
| JP | 2008-014887 | 1/2008 |
| JP | 2008-096138 A | 4/2008 |
| JP | 2008-157856 A | 7/2008 |
| JP | 2008-209215 | 9/2008 |
| JP | 2008-224627 A | 9/2008 |
| JP | 2012-112748 | 6/2012 |

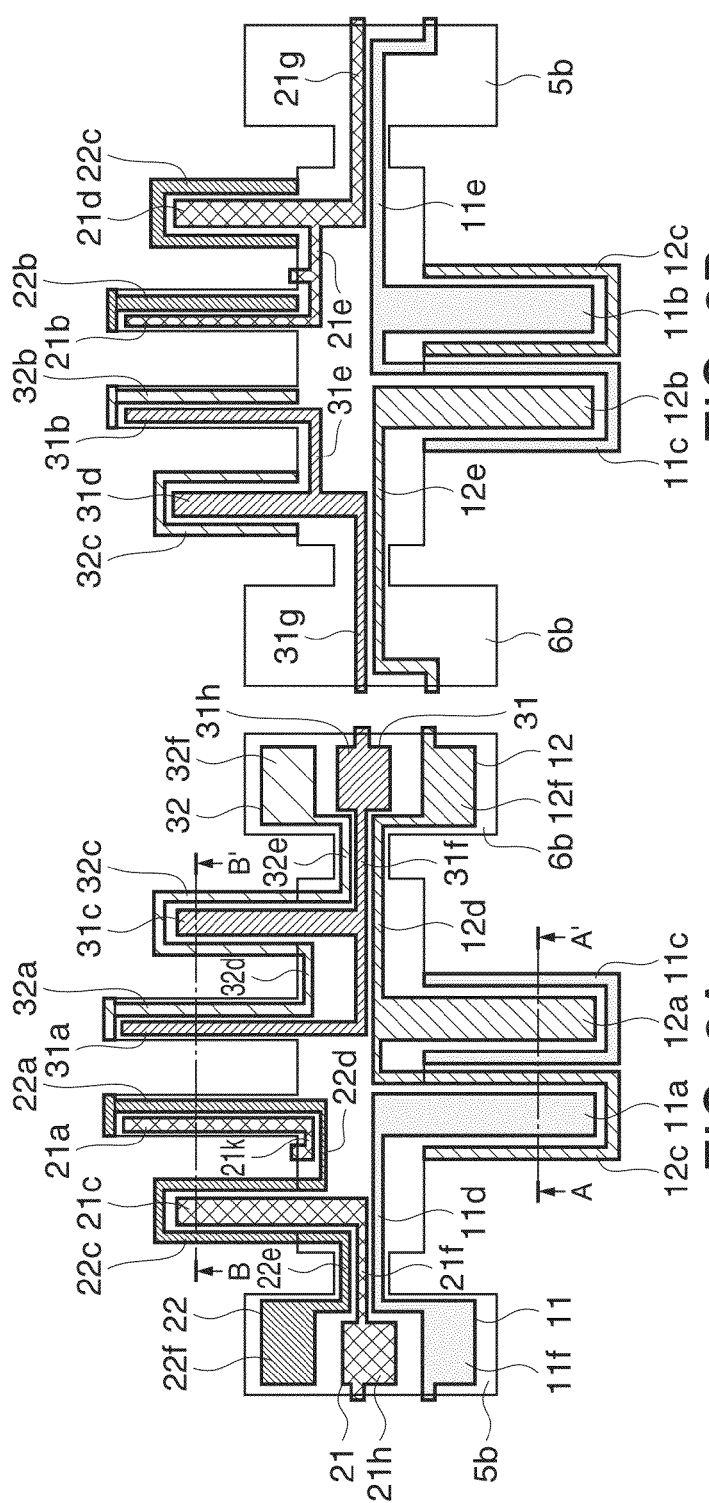

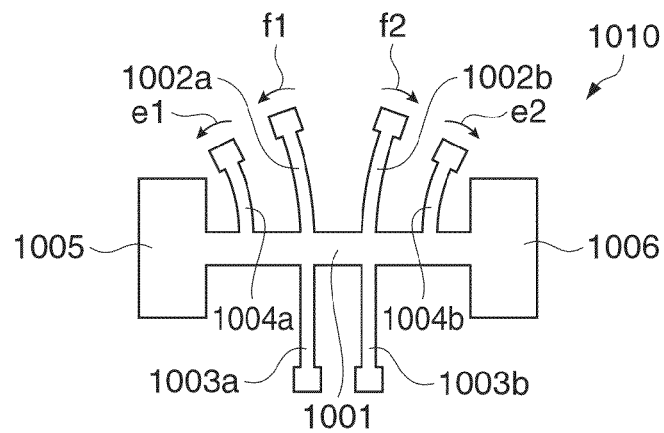
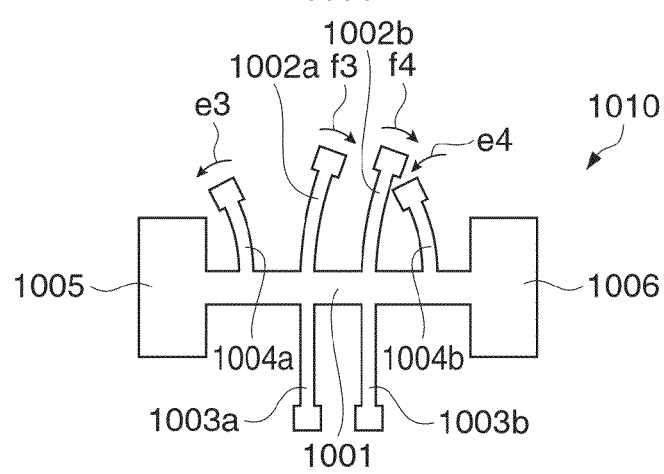
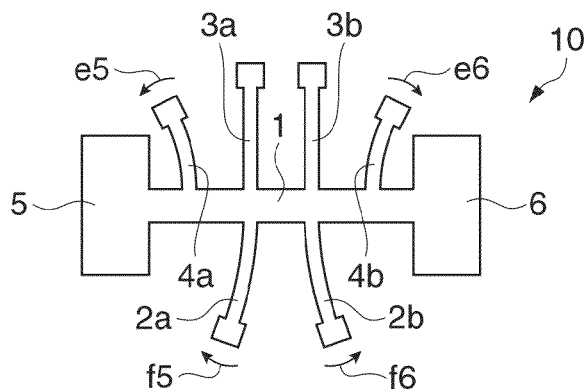
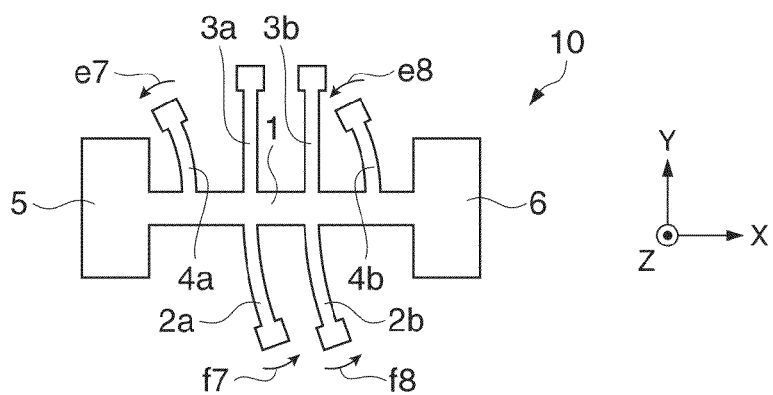
FIG. 8A
FIG. 8B
FIG. 8C
FIG. 8D

VIBRATOR ELEMENT, SENSOR UNIT, AND ELECTRONIC DEVICE

BACKGROUND

1. Technical Field

The present invention relates to a vibrator element, a sensor unit, and an electronic device.

2. Related Art

There is widely used a vibration gyro sensor (hereinafter referred to as a vibration gyro) as an angular velocity sensor for enhancing the vehicle body control in vehicles, the vehicle localization of car navigation systems, and the vibration control correction function (so-called image stabilization) in digital cameras and digital video cameras, and so on. The vibration gyro is a device using a gyro vibrator element formed of a piezoelectric single-crystal substance such as quartz crystal as a high-modulus material and for detecting an electric signal as an angular velocity, the electric signal being generated in a part of the gyro vibrator element due to a vibration such as a tremor or a rotation of an object, and thus obtaining the displacement of the object by calculating the rotational angle.

As the vibrator element used for the gyro sensor, there is widely used a piezoelectric vibrator element (a gyro element) formed of a piezoelectric material such as quartz crystal (see, e.g., JP-A-5-256723 (Document 1)). The vibrator element described in Document 1 is a so-called tuning-fork piezoelectric vibrator element including a base section made of quartz crystal and a pair of vibrating arms extending from an end portion of the base section in parallel to each other. The primary surface (a first surface) of each of the vibrating arms is provided with a drive electrode (an excitation electrode) for supplying a drive voltage for exciting the vibrating arms, and a side surface perpendicular to the first surface is provided with a detection electrode. Further, by applying a drive signal (an excitation signal) to the drive electrode, the vibrating arms can be vibrated. Here, when applying the drive signal to the vibrator element to thereby cause a vibration (in-plane vibration) in a direction along the first surface in each of the vibrating arms, if the vibrator element is rotated taking an axis (e.g., the Y axis in the case of a gyro element having a quartz crystal Z plate as the substrate) in the extending direction of the vibrating arms as a detection axis, a vibration (out-of-plane vibration) in a direction perpendicular to the first surface is caused in the vibrating arms due to the Coriolis force. The amplitude of the out-of-plane vibration is proportional to the rotational speed of the vibrator element, and can therefore be detected as the angular velocity.

The base section and the vibrating arms of such a gyro element can integrally be formed by performing an etching process on a piezoelectric material such as quartz crystal using photolithography. Although the vibrating arms are originally designed to have a rectangular cross-sectional shape, the cross-sectional shape fails to be a rectangular shape, but exhibits a parallelogram or a rhombus, or a more complicated irregular form due to the etching anisotropy of the quartz crystal and the variation in the manufacturing process. In this case, if the cross-sectional shape of the vibrating arms is significantly different from the rectangular shape of the original design, the vibration direction of the vibrating arms is shifted from a design value to cause an unwanted vibration leakage called a leakage output, which is a factor of deteriorating the detection sensitivity of the gyro element. A gyro element having a cutting portion disposed in the vicinity of the root of the vibrating arms with respect to the base section as a measure for suppressing such a leakage output is introduced in, for example, JP-A-2008-209215 (Document 2).

The gyro element (angular velocity sensor element) of Document 2 has the base section and the vibrating arms extending from the base section, and the vibrating arms are provided with the drive electrodes for exciting the vibration in the width direction of the vibrating arms, and the detection electrodes (detecting electrodes) for detecting the charge due to the vertical vibration corresponding to the thickness direction of the vibrating arms. Further, a plurality of cutting portions formed by a laser process are disposed in at least one of end portions in the width direction of the vibrating arms in the vicinity of the root of the vibrating arms with respect to the base section. It is described that the leakage output (an oblique vibration) can be suppressed by varying the mass distribution using the cutting portions disposed in the vicinity of the root of the vibrating arms with respect to the base section.

However, in the gyro element described in Document 2, it is required to provide the extremely fine cutting portions in order for performing the fine adjustment for suppressing the leakage output, and there is a problem that it becomes more difficult to form the cutting portions in accordance with the miniaturization of the gyro element (the vibrator element) proceeding in recent years, and at the same time, the mechanical strength of the gyro element is degraded due to the formation of the cutting portions.

SUMMARY

An advantage of some aspects of the invention is to solve at least a part of the problems described above, and the invention can be implemented as the following aspects or application examples.

Application Example 1

This application example is directed to a vibrator element including a base section, a driving vibrating arm extending from one end of the base section, a detecting vibrating arm extending from another end of the base section opposite to the one end, an adjusting vibrating arm extending from the base section in a direction opposite to a direction in which the driving vibrating arm extends, and a support section extending from the base section and to be fixed to a substrate, and an output signal of the adjusting vibrating arm has a reverse phase with respect to an output signal of a leakage vibration of the detecting vibrating arm.

According to the vibrator element of this application example, by partially removing or performing addition of an adjustment section of the adjusting vibrating arm, a leakage output of the vibration of the driving vibrating arm and the detecting vibrating arm can be canceled out and thus suppressed. Therefore, since it is advantageous to the miniaturization and it becomes possible to perform the fine adjustment compared to the method in the related art of partially processing the outer shape of the vibrator element to thereby performing the suppression adjustment of the leakage output, it is possible to provide the vibrator element, which is small in size, high in mechanical strength, and has highly sensitive characteristics.

Further, if the adjusting vibrating arm is provided to the base section, a "Tu" mode vibration (a so-called tuning-fork vibration) and a "TuX" mode vibration in which two arms move in-phase are generated. However, in the vibrator element according to the present application example, since the driving vibrating arm and the adjusting vibrating arm extend from the base section in the respective directions opposite to each other, the coupling in the "TuX" mode can be avoided (the frequency of the "TuX" mode vibration can be moved away from the drive frequency), and as a result, a leakage signal can be suppressed. In the detailed description, in the "TuX" mode, by making the driving vibrating arm and the adjusting vibrating arm extend from the base section in the respective directions opposite to each other, the rotational force is applied to the entire vibrator element taking the center of the base section as a base point. By fixing the support section, the rotational force can be suppressed. Thus, only the frequency of the "TuX" mode vibration is significantly lowered, and the frequency of the "TuX" mode vibration can be moved away from the drive frequency, which is the mechanism of the suppression of the leakage signal.

Further, it is possible to provide the support section fixed to the base section, and to hold driving, detecting, and adjusting driving arm sections including the base section to a package using the support section. Thus, the vibration leakage from each of the vibrating arms to the package can be suppressed, and therefore, the highly sensitive and highly accurate vibrator element can be obtained.

Application Example 2

This application example is directed to the vibrator element according to the above application example, wherein the driving vibrating arm is a pair of driving vibrating arms, the detecting vibrating arm is a pair of detecting vibrating arms, and the adjusting vibrating arm is a pair of adjusting vibrating arms disposed so that the pair of detecting vibrating arms are located between the pair of adjusting vibrating arms.

According to this application example described above, each of the driving vibrating arm, the detecting vibrating arm, and the adjusting vibrating arm is composed of a pair of vibrating arms. Since each of the vibration arms is composed of a pair of arms, namely a so-called tuning-fork type, the vibration of the root thereof is suppressed, and as a result, it becomes possible to suppress the vibration leakage from each of the vibrating arms to the package.

Application Example 3

This application example is directed to the vibrator element according to the above application example, wherein the support section includes a first connection section and a second connection section each having one end connected to the base section, a first fixation section connected to another end of the first connection section, and a second fixation section connected to another end of the second connection section.

According to this application example described above, since the vibration leakage from each of the vibrating arms to the package can further be suppressed by fixing the vibrator element to the package in the fixation sections via the connection sections, the highly sensitive and highly accurate vibrator element can be obtained.

Application Example 4

This application example is directed to the vibrator element according to the above application example, wherein the first fixation section and the second fixation section are connected to each other.

According to this application example described above, the mechanical strength of the vibrator element can be increased, and further, the area fixed to the package with an adhesive or the like can be enlarged. Therefore, since it is possible to achieve the increase in mechanical strength of an electronic component such as a sensor equipped with the vibrator element according to the present application example, and the suppression of the vibration leakage from each of the vibrating arms to the package, the highly sensitive and highly accurate vibrator element can be obtained.

Application Example 5

This application example is directed to the vibrator element according to the above application example, wherein the detecting vibrating arm is provided with a detection electrode, the adjusting vibrating arm is provided with a metal film, and the metal film and the detection electrode are electrically connected to each other.

According to this application example described above, by controlling the charge (current) of the adjusting vibrating arm by partially removing the metal film provided to the adjustment section of the adjusting vibrating arm by, for example, laser irradiation, or attaching the metal film by vapor deposition or sputtering, a finer suppression adjustment of the leakage output can be performed.

Application Example 6

This application example is directed to the vibrator element according to the above application example, wherein a wide portion is disposed at a tip portion of the adjusting vibrating arm on an opposite side to a side of the base section.

According to this application example described above, since the suppression effect of the leakage vibration can be enhanced while preventing the increase in the length of the adjusting vibrating arm, and at the same time, the adjustment range for suppressing the leakage vibration can be broadened, it is possible to provide the vibrator element, which is small in size and has highly sensitive characteristics.

Application Example 7

This application example is directed to the vibrator element according to the above application example, wherein a length of the adjusting vibrating arm is shorter than a length of the driving vibrating arm and a length of the detecting vibrating arm.

According to this application example described above, since the vibration of the adjusting vibrating arm for adjusting the leakage output does not hinder the primary vibration of the vibrator element by the driving vibrating arm and the detecting vibrating arm, the vibration characteristics of the vibrator element are stabilized, and an advantageous effect to the miniaturization of the vibrator element can also be obtained.

Application Example 8

This application example is directed to a vibrator element formed of a base material having a thickness t, including a base section, a pair of detecting vibrating arms extending from one end of the base section, a pair of driving vibrating arms extending from another end of the base section opposite to the one end, and a pair of adjusting vibrating arms extending from either one of the one end and the other end, and disposed so that either one of the pair of detecting vibrating arms and the pair of driving vibrating arms is located between the adjusting vibrating arms, wherein a relationship between the thickness t, a distance B between one of the pair of detecting vibrating arms and the pair of driving vibrating arms, a distance A between one of the pair of adjusting vibrating arms and one of the pair of detecting vibrating arms or the pair of driving vibrating arms adjacent to the one of the pair of adjusting vibrating arms, and a distance C between the other of the pair of adjusting vibrating arms and the other of the pair of detecting vibrating arms or the pair of driving vibrating arms adjacent to the other of the pair of adjusting vibrating arms is as follows.

$B<t,$ $B\times0.8<A<B\times1.2,$ and $B\times0.8<C<B\times1.2$

According to the vibrator element of this application example, the relationship between the thickness t of each of the vibrating arms (the base material), the distance B between the pair of arms of the detecting vibrating arms or the driving vibrating arms, and the distance A and the distance C between the detecting vibrating arm or the driving vibrating arm and the adjusting vibrating arm adjacent to each other is as follows.

$B<t,$ $B\times0.8<A<B\times1.2,$ and $B\times0.8<C<B\times1.2$

As described above, by constituting the distance A and the distance C between the detecting vibrating arm or the driving vibrating arm and the adjusting vibrating arm adjacent to each other using the distance B between the pair of arms of the detecting vibrating arms or the driving vibrating arms as a reference, it becomes possible to stably form the outer shape of a connection section between the base section and each of the vibrating arms. The outer shape of the connection section corresponds to the shape of corner portions formed inside the pair of arms of the detecting vibrating arms or the driving vibrating arms so as to be opposed to each other. Or, the outer shape of the connection section corresponds to the shape of a pair of corner portions formed inside the area where the detecting vibrating arm or the driving vibrating arm and the adjusting vibrating arm face each other.

It should be noted that it is known that the outer shape of the connection section between the base section and each of the vibrating arms is apt to be unstable if the relationship between the thickness t of each of the vibrating arms (the base material) and the distance B between the pair of arms of the detecting vibrating arms or the driving vibrating arms fulfills B<t.

However, by constituting the distance A and the distance C between the detecting vibrating arm or the driving vibrating arm and the adjusting vibrating arm adjacent to each other using the distance B as a reference as in the present application example, it becomes possible to stably form the outer shape of the connection section between the base section and each of the vibrating arms despite the configuration of B<t.

Thus, it becomes possible to suppress the vibration leakage output or the unwanted mode vibration (the TuX mode vibration) caused by the variation in the outer shape of the connection section between the base section and each of the vibrating arms, and thus the vibration characteristics of the vibrator element can be stabilized. Therefore, the highly sensitive and highly accurate vibrator element can be obtained.

As described above, according to the vibrator element of this application example, since the suppression of the vibration leakage output or the suppression of the unwanted mode vibration (the TuX mode vibration) becomes possible without providing an ultrafine cutting section, the vibrator element is advantageous to the miniaturization compared to the related art. Further, since the fine adjustment becomes possible, the vibrator element, which is small in size, high in mechanical strength, and has highly sensitive characteristics, can be provided.

Application Example 9

This application example is directed to the vibrator element according to the above application example, which further includes a pair of balancing vibrating arms disposed so that the pair of adjusting vibrating arms are located between the pair of balancing vibrating arms, a relationship between a distance D between one of the pair of balancing vibrating arms and one of the pair of adjusting vibrating arms adjacent to the one of the pair of balancing vibrating arms, and a distance E between the other of the pair of balancing vibrating arms and the other of the pair of adjusting vibrating arms adjacent to the other of the pair of balancing vibrating arms is as follows.

$A\times0.8<D<A\times1.2,$ and $C\times0.8<E<C\times1.2$

According to this application example described above, the balancing vibrating arms are provided in addition to the application examples described above. Further, the relationship between the distance D between one of the adjusting vibrating arms and one of the balancing vibrating arms and the distance E between the other of the adjusting vibrating arms and the other of the balancing vibrating arms is as follows.

$A\times0.8<D<A\times1.2,$ and $C\times0.8<E<C\times1.2$

As described above, since the balancing vibrating arms are provided, it becomes possible to further suppress the vibration leakage output or the unwanted mode vibration (the TuX mode vibration). Further, in addition thereto, by setting the distances between the vibrating arms so as to satisfy the following, it becomes possible to obtain substantially the same advantages as in the application examples described above.

$A\times0.8<D<A\times1.2,$ and $C\times0.8<E<C\times1.2$

Application Example 10

This application example is directed to the vibrator element according to the above application example, wherein the pair of detecting vibrating arms are each provided with a detecting electrode, the pair of adjusting vibrating arms are each provided with a metal film, and the metal film and the detecting electrode are electrically connected to each other.

According to this application example described above, by controlling the charge (current) of the adjusting vibrating arms by partially removing the metal film provided to an adjustment section of each of the adjusting vibrating arms by, for example, laser irradiation, or attaching the metal film by vapor deposition or sputtering, a finer suppression adjustment of the leakage output can be performed.

Application Example 11

This application example is directed to the vibrator element according to the above application example, wherein a wide portion is disposed at a tip portion of each of the pair of adjusting vibrating arms on an opposite side to a side of the base section.

According to this application example described above, since the suppression effect of the leakage vibration can be enhanced while preventing the increase in the length of the adjusting vibrating arms, and at the same time, the adjustment range for suppressing the leakage vibration can be broadened, it is possible to provide the vibrator element, which is small in size and has highly sensitive characteristics.

Application Example 12

This application example is directed to the vibrator element according to the above application example, wherein a length of the pair of adjusting vibrating arms is shorter than a length of the pair of driving vibrating arms and a length of the pair of detecting vibrating arms.

According to this application example described above, since the vibration of the adjusting vibrating arms for adjusting the leakage output does not hinder the primary vibration of the vibrator element by the driving vibrating arms and the detecting vibrating arms, the vibration characteristics of the vibrator element are stabilized, and an advantageous effect to the miniaturization of the vibrator element can also be obtained.

Application Example 13

This application example is directed to a sensor unit including any one of the vibrator elements described above, an electronic component including a drive circuit adapted to excite the driving vibrating arms, and a detection circuit adapted to detect a detection signal generated in the detecting vibrating arms, and a package housing the vibrator element and the electronic component.

According to the sensor unit of this application example, the sensor unit equipped with the vibrator element having an advantage described in either one of the application examples described above can be obtained as the sensor unit. In addition, the package type sensor unit having the configuration described above is advantageous to the miniaturization and thickness reduction, and at the same time, has an improved impact resistance.

Application Example 14

This application example is directed to an electronic device including the sensor unit according to the application example described above.

According to the electronic device of this application example, since the electronic device is equipped with the highly sensitive vibrator element on which the adjustment for suppressing the leakage output is performed according to any one of the application examples described above, the electronic device, which is highly functional, and has stable characteristics, can be provided.

BRIEF DESCRIPTION OF THE DRAWINGS

The invention will be described with reference to the accompanying drawings, wherein like numbers reference like elements.

FIGS. 1A and 1B are diagrams showing a gyro element according to a first embodiment of the invention, wherein FIG. 1A is a perspective view, and FIG. 1B is a plan view.

FIGS. 2A through 2D are diagrams showing an electrode arrangement of the gyro element according to the first embodiment, wherein FIG. 2A is a plan view of one surface, FIG. 2B is a plan view of the other surface, FIG. 2C is a cross-sectional view of the A-A' section shown in FIG. 2A, and FIG. 2D is a cross-sectional view of the B-B' section shown in FIG. 2A.

FIGS. 5A and 5B are diagrams showing a gyro sensor according to a second embodiment of the invention, wherein FIG. 5A is a plan view, and FIG. 5B is a cross-sectional view of the C-C' section shown in FIG. 5A.

FIGS. 8A through 8D are schematic diagrams showing vibration directions of the gyro element for explaining a "TuX" mode vibration, wherein FIGS. 8A and 8B are plan views showing vibration modes of a gyro element in a comparative example, and FIGS. 8C and 8D are plan views showing vibration modes of the gyro element according to the embodiment of the invention.

FIGS. 9A and 9B are diagrams schematically showing a gyro element according to a third embodiment of the invention, wherein FIG. 9A is a perspective view, and FIG. 9B is a plan view.

FIGS. 14A and 14B are diagrams showing another gyro sensor, wherein FIG. 14A is a plan view, and FIG. 14B is a cross-sectional view of the D-O-D' section shown in FIG. 14A.

DESCRIPTION OF EXEMPLARY EMBODIMENTS

Some embodiments according to the invention will hereinafter be explained with reference to the accompanying drawings.

First Embodiment

Figure 1A:
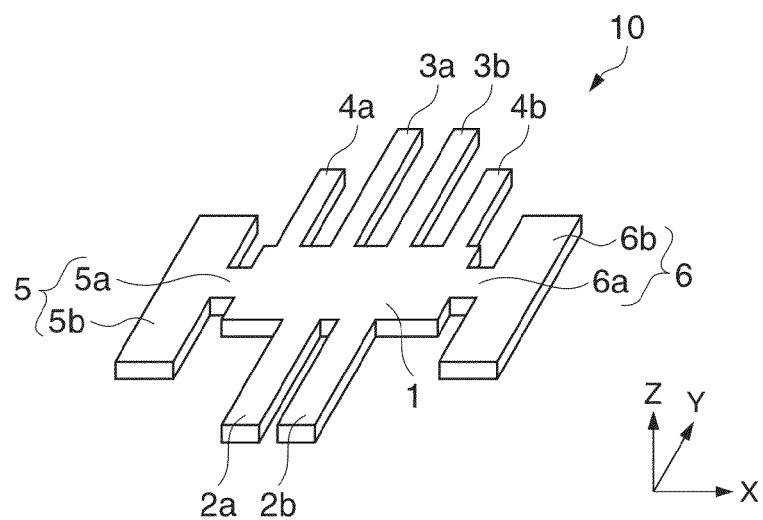
Figure 1B:
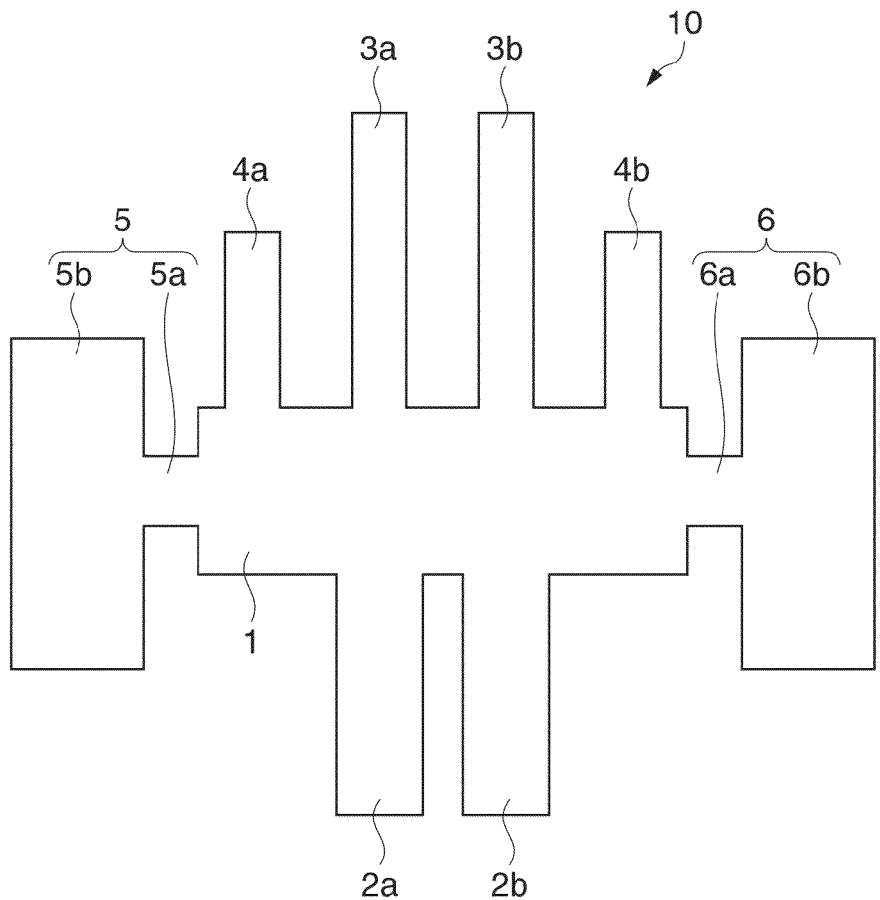

Firstly, an embodiment in which a vibrator element according to the invention is embodied as a vibration gyro element will be explained. FIGS. 1A and 1B are diagrams showing an example of the vibration gyro element as the vibrator element, wherein FIG. 1A is a perspective view showing it schematically, and FIG. 1B is a plan view showing it schematically. As shown in FIG. 1A, a vibration gyro element 10 (hereinafter referred to as a gyro element 10) as the vibrator element has a base section 1 integrally formed by processing a base material (a material constituting an essential part), driving vibrating arms 2a, 2b and detecting vibrating arms 3a, 3b as first vibrating arms, and adjusting vibrating arms 4a, 4b as second vibrating arms. Further, a first support section 5 is formed of a first connection section 5a extending from the base section 1 and a first fixation section 5b connected to the first connection section 5a and to be fixed to a substrate such as a package not shown, and a second support section 6 is formed of a second connection section 6a extending from the base section 1 and a second fixation section 6b connected to the second connection section 6a and to be fixed to the substrate such as the package not shown.

An example of the gyro element 10 according to the present embodiment using quartz crystal, which is a piezoelectric material, as the base material will be explained. The quartz crystal has an X axis (a crystal axis of the quartz crystal) called an electrical axis, a Y axis called a mechanical axis, and a Z axis called an optical axis. In the present embodiment, there is explained an example of using a so-called quartz crystal Z plate as the base material. The quartz crystal Z plate is carved out along a plane defined by the X axis and the Y axis perpendicular to each other in the crystal axes of the quartz crystal, then processed to have a plate-like shape, and has a predetermined thickness in the Z-axis direction perpendicular to the plane. It should be noted that the predetermined thickness mentioned here is appropriately set in accordance with the oscillation frequency (resonant frequency), the outside dimension, the workability, and so on. Further, the plate forming the gyro element 10 can allow the error in the angle, at which the plate is carved out from the quartz crystal, in some range with respect to each of the X axis, Y axis, and Z axis. For example, it is possible to use the plate carved out after being rotated in a range of 0 through 2 degrees around the X axis. The same applies to the Y axis and the Z axis.

The gyro element 10 has the base section 1 having a roughly rectangular shape and located at a central portion, the driving vibrating arms 2a, 2b as a pair of first vibrating arms extending in parallel to each other from one (in the −Y direction in the drawing) of end portions in the ±Y-axis directions of the base section 1 along the Y axis, and the detecting vibrating arms 3a, 3b as a pair of first vibrating arms extending in parallel to each other from the other (in the +Y direction) of the end portions of the base section 1 along the Y axis. As described above, the pair of driving vibrating arms 2a, 2b and the pair of detecting vibrating arms 3a, 3b respectively extend from the both end portions of the base section 1 in the same axis directions. Due to such a shape as described above, the gyro element 10 according to the present embodiment may sometimes be called an H-type vibrator element (an H-type gyro element). Since the driving vibrating arms 2a, 2b and the detecting vibrating arms 3a, 3b respectively extend from the both end portions in the same axis directions of the base section 1, a drive system and a detection system are separated from each other to thereby reduce the capacitive coupling between electrodes or wiring lines of the drive system and the detection system, and therefore the H-type gyro element 10 has a feature that the detection sensitivity is stabilized. It should be noted that although the pair of driving vibrating arms and the pair of detecting vibrating arms are provided in the present embodiment taking the H-type vibrator element as the example, the number of vibrating arms can also be one or more than two. Further, it is also possible to provide a drive electrode and a detection electrode to one vibrating arm.

Further, the gyro element 10 has the adjusting vibrating arms 4a, 4b as a pair of second vibrating arms extending from the base section 1 in a direction intersecting with the crystal X axis (the electrical axis) of the quartz crystal in parallel to the detecting vibrating arms 3a, 3b so as to have the detecting vibrating arms 3a, 3b therebetween. In other words, the adjusting vibrating arms 4a, 4b extend from the other end portion (in the +Y direction in the drawing) of the base section 1 along the Y axis (in the +Y direction). The adjusting vibrating arms 4a, 4b as the second vibrating arms are formed to have a length smaller than the lengths of the driving vibrating arms 2a, 2b and the detecting vibrating arms 3a, 3b as the first vibrating arms. Thus, since the vibration of the adjusting vibrating arms 4a, 4b for adjusting a leakage output does not hinder the primary vibration of the gyro element 10 by the first vibrating arms (the driving vibrating arms and the detecting vibrating arms), the vibration characteristics of the gyro element 10 are stabilized, and at the same time an advantageous effect to the miniaturization of the gyro element 10 can be obtained.

The center of the base section 1 can be the center of gravity of the gyro element 10. It is assumed that the X axis, the Y axis, and the Z axis are perpendicular to each other, and pass through the center of gravity. The outer shape of the gyro element 10 can be axisymmetric about an imaginary center line in the Y-axis direction passing through the center of gravity. Thus, the gyro element 10 has a well-balanced outer shape, and the characteristics of the gyro element 10 are stabilized to thereby preferably enhance the detection sensitivity. Such an outer shape of the gyro element 10 can be formed by etching (wet etching or dry etching) using a photolithography technology. It should be noted that a plurality of such gyro elements 10 can be obtained from a single quartz crystal wafer.

Then, an example of an electrode arrangement of the gyro element 10 will be explained. FIGS. 2A through 2D are diagrams showing the electrode arrangement of the gyro element 10 according to the first embodiment, wherein FIG. 2A is a plan view showing the electrode arrangement on one primary surface side, FIG. 2B is a plan view showing the electrode arrangement on the other primary surface side, FIG. 2C is a cross-sectional view in the A-A' section of the driving vibrating arms 2a, 2b shown in FIG. 2A, and FIG. 2D is a cross-sectional view in the B-B' section of the detecting vibrating arms 3a, 3b and the adjusting vibrating arms 4a, 4b shown in FIG. 2A.

As shown in FIG. 2A, electrodes 11, 12 are formed for driving the driving vibrating arms 2a, 2b. As shown in FIGS. 2A, 2B, and 2C, regarding the electrodes 11, 12, a driving electrode 11a is formed on one primary surface 2c of the driving vibrating arm 2a, and a driving electrode 11b is formed on the other primary surface 2d thereof. Further, on one side surface 2e of the driving vibrating arm 2a and the other side surface 2f thereof, there is formed a driving electrode 12c so as to cover the tip of the driving vibrating arm 2a. Similarly, a driving electrode 12a is formed on one primary surface 2g of the driving vibrating arm 2b, and a driving electrode 12b is formed on the other primary surface 2h thereof. Further, on one side surface 2j of the driving vibrating arm 2b and the other side surface 2k thereof, there is formed a driving electrode 11c so as to cover the tip of the driving vibrating arm 2b.

The driving electrodes 11a, 11b, 11c, 12a, 12b, and 12c provided to the driving vibrating arms 2a, 2b are arranged so that the driving electrodes disposed to be opposed to each other via the driving vibrating arms 2a, 2b have the same electrical potential. As shown in FIGS. 2A and 2B, the electrode 11 has a connection pad 11f, which is connected via wiring lines 11d, 11e, and is provided to the first fixation section 5b. Further, the electrode 12 has a connection pad 12f, which is connected via wiring lines 12d, 12e, and is provided to the second fixation section 6b. Further, by applying an electrical potential difference alternately between the electrode 11 and the electrode 12 through the connection pad 11f and the connection pad 12f, a so-called tuning-fork vibration is excited in the driving vibrating arms 2a, 2b.

Then the detecting electrodes provided to the detecting vibrating arms 3a, 3b, and for detecting the distortion generated in the quartz crystal as the base material due to the vibration of the detecting vibrating arms 3a, 3b will be explained.

As shown in FIGS. 2A, 2B, and 2D, regarding electrodes 21, 22, detecting electrodes 21a, 22a are formed on one primary surface 3c of the detecting vibrating arm 3a along the extending direction of the detecting vibrating arm 3a. Further, on the other primary surface 3d on the opposite side to the primary surface 3c, there are formed detecting electrodes 21b, 22b along the extending direction of the detecting vibrating arm 3a. Further, the detecting electrode 22a and the detecting electrode 22b are electrically connected to each other via a tip portion of the detecting vibrating arm 3a, and the detecting electrodes 21a, 21b are disposed so as to extend to the vicinity of the tip of the detecting vibrating arm 3a. The detecting electrodes 21a, 21b are electrically connected to a connection pad 21h provided to the first fixation section 5b via wiring lines 21k, 21e, an adjusting electrode 21d provided to the adjusting vibrating arm 4a described later, and a wiring line 21g. Further, the detecting electrodes 22a, 22b are electrically connected to a connection pad 22f provided to the first fixation section 5b via a wiring line 22d, an adjusting electrode 22c provided to the adjusting vibrating arm 4a described later, and a wiring line 22e.

The detecting electrode 21a and the detecting electrode 21b are connected to each other so as to have the same electrical potential, and the detecting electrode 22a and the detecting electrode 22b are connected to each other so as to have the same electrical potential. Thus, the distortion generated by the vibration of the detecting vibrating arm 3a can be detected by detecting the electrical potential difference between the detecting electrodes 21a, 21b and the detecting electrodes 22a, 22b. In other words, the electrical potential difference between the electrode 21 and the electrode 22 is detected from the connection pads 21h, 22f.

Similarly, regarding electrodes 31, 32, detecting electrodes 31a, 32a are formed on one primary surface 3e of the detecting vibrating arm 3b along the extending direction of the detecting vibrating arm 3b. Further, on the other primary surface 3f on the opposite side to the primary surface 3e, there are also formed detecting electrodes 31b, 32b along the extending direction of the detecting vibrating arm 3b. Further, the detecting electrode 32a and the detecting electrode 32b are electrically connected to each other via a tip portion of the detecting vibrating arm 3b, and the detecting electrodes 31a, 31b are disposed so as to extend to the vicinity of the tip of the detecting vibrating arm 3b.

The detecting electrodes 31a, 31b are electrically connected to a connection pad 31h provided to the second fixation section 6b via wiring lines 31e, 31f, and 31g, and an adjusting electrode 31d provided to the adjusting vibrating arm 4b described later. Further, the detecting electrodes 32a, 32b are electrically connected to a connection pad 32f provided to the second fixation section 6b via a wiring line 32d, an adjusting electrode 32c provided to the adjusting vibrating arm 4b described later, and a wiring line 32e.

Further, the detecting electrode 31a and the detecting electrode 31b are connected to each other so as to have the same electrical potential, and the detecting electrode 32a and the detecting electrode 32b are connected to each other so as to have the same electrical potential. Thus, the distortion generated by the vibration of the detecting vibrating arm 3b can be detected by detecting the electrical potential difference between the detecting electrodes 31a, 31b and the detecting electrodes 32a, 32b. In other words, the electrical potential difference between the electrode 31 and the electrode 32 is detected from the connection pads 31h, 32f.

Then, electrodes as an adjustment section provided to the adjusting vibrating arms 4a, 4b will be explained. As shown in FIGS. 2A, 2B, and 2D, in the adjusting vibrating arm 4a, an adjusting electrode 21c is formed on one primary surface 4c, and the adjusting electrode 21d is formed on the other primary surface 4d on the opposite side to the primary surface 4c, as the adjusting electrodes having the same electrical potential. Further, the adjusting electrode 22c is formed on one side surface 4e of the adjusting vibrating arm 4a, and the adjusting electrode 22c contiguous to the adjusting electrode 22c of the side surface 4e via the tip of the adjusting vibrating arm 4a is formed on the other side surface 4f on the opposite side to the side surface 4e.

The adjusting electrodes 21c, 21d are connected to the connection pad 21h via a wiring line 21f and the wiring line 21g. Further, the adjusting electrode 22c is electrically connected to the connection pad 22f via the wiring line 22e. Similarly, in the adjusting vibrating arm 4b, an adjusting electrode 31c is formed on one primary surface 4g, and the adjusting electrode 31d is formed on the other primary surface 4h on the opposite side to the primary surface 4g, as the adjusting electrodes having the same electrical potential. Further, the adjusting electrode 32c is formed on one side surface 4j of the adjusting vibrating arm 4b, and the adjusting electrode 32c contiguous to the adjusting electrode 32c of the side surface 4j via the tip of the adjusting vibrating arm 4b is formed on the other side surface 4k on the opposite side to the side surface 4j. The adjusting electrodes 31c, 31d are connected to the connection pad 31h via the wiring lines 31f, 31g. Further, the adjusting electrode 32c is electrically connected to the connection pad 32f via the wiring line 32e.

As described above, according to the gyro element 10 related to the present embodiment, if an angular velocity is applied to the gyro element 10 in the state in which the driving vibrating arms 2a, 2b are vibrated by applying a predetermined excitation drive signal, the vibration due to the Coriolis force is caused in the detecting vibrating arms 3a, 3b. Due to the vibration of the detecting vibrating arms 3a, 3b, the adjusting vibrating arms 4a, 4b are excited. Therefore, by varying the charge amount by increasing or decreasing the weight of the adjusting electrodes 21c, 21d, 22c, 31c, 31d, and 32c as a metal film provided to the adjusting vibrating arms 4a, 4b or increasing or decreasing the volume of the adjusting electrodes 21c, 21d, 22c, 31c, 31d, and 32c, it is possible to suppress the unwanted leakage output of the detecting vibrating arms 3a, 3b.

Therefore, it is possible to suppress the degradation of the detection sensitivity caused by the leakage output, which can occur due to the variation in the cross-sectional shape of the driving vibrating arms 2a, 2b and the detecting vibrating arms 3a, 3b caused by, for example, the etching anisotropy of the quartz crystal as the base material of the gyro element 10 and the production tolerance, and thus, it is possible to provide the gyro element 10 as a vibrator element with high sensitivity.

Figure 3A:
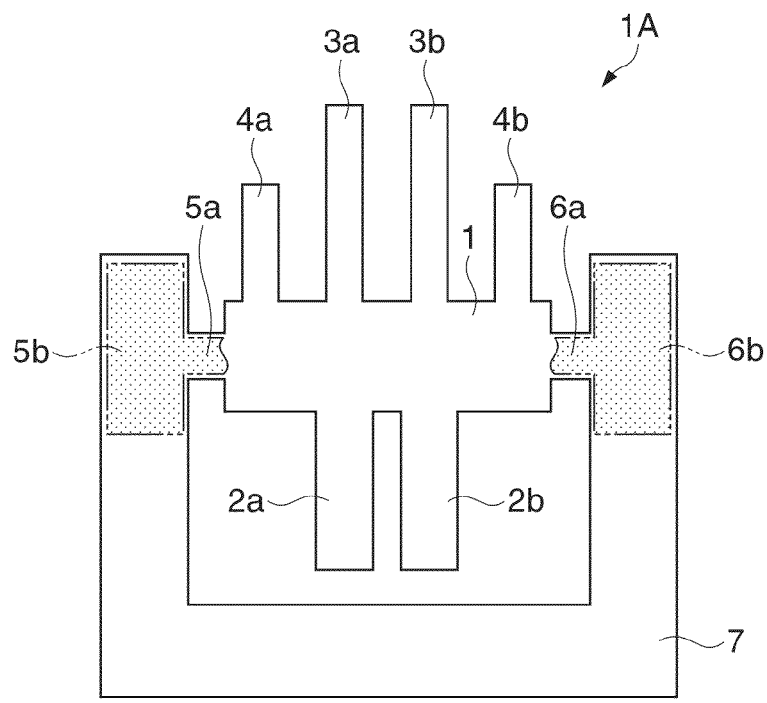
FIGS. 3A and 3B are plan views showing configurations of other gyro elements.
Figure 3B:
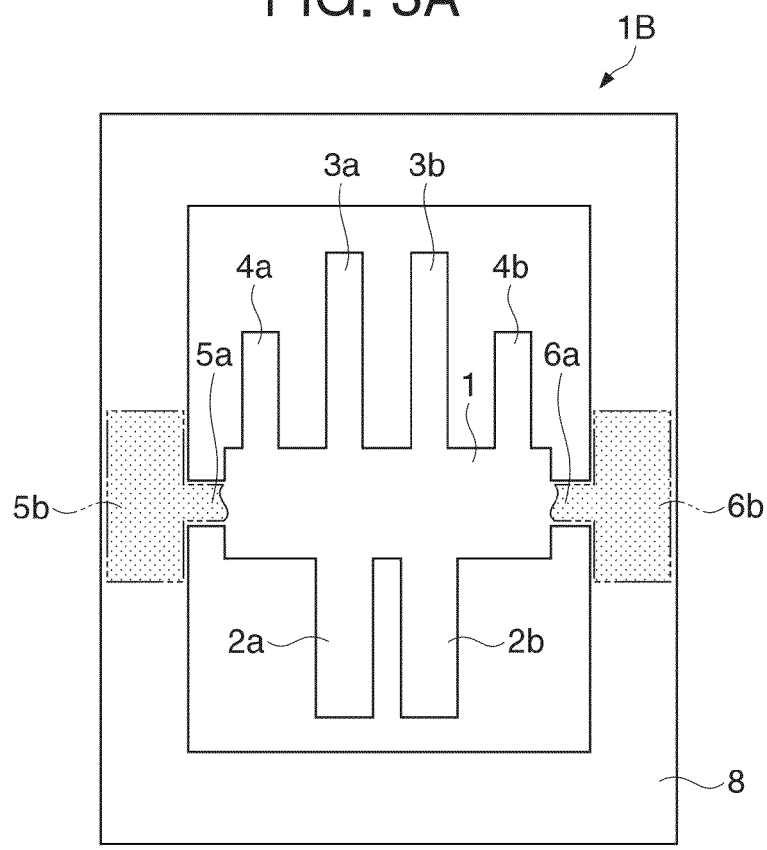

FIGS. 3A and 3B are plan views showing other configurations of the gyro element 10 according to the first embodiment. In a gyro element 1A shown in FIG. 3A, a fixation section 7 connected to the base section 1 with the connection sections 5a, 6a has a frame-like shape. Specifically, there is formed the fixation section 7 composed of the first fixation section 5b and the second fixation section 6b in the gyro element 10 according to the first embodiment integrally connected to each other on the driving vibrating arms 2a, 2b side in the present embodiment.

Further, a gyro element 1B shown in FIG. 3B has a configuration in which the base section 1, the driving vibrating arms 2a, 2b, the detecting vibrating arms 3a, 3b, and the adjusting vibrating arms 4a, 4b are disposed inside a fixation section 8 having a frame-like shape, and the base section 1 and the fixation section 8 are connected to each other via the connection sections 5a, 6a.

As described above, according to the gyro elements 1A, 1B shown in FIGS. 3A and 3B, by adopting the fixation section 7 or the fixation section 8 with a large fixation area to be fixed to the package described later to thereby increase the fixation force when forming a gyro unit housing the gyro element 1A or 1B in the package, the vibration leakage to the package can be suppressed. Further, since the fixation section 7 or the fixation section 8 has the frame-like shape, it is possible to increase the strength of the gyro element 1A, 1B to thereby suppress the vibration leakage to the fixation section 7 or the fixation section 8.

Modified Example

Figure 4:
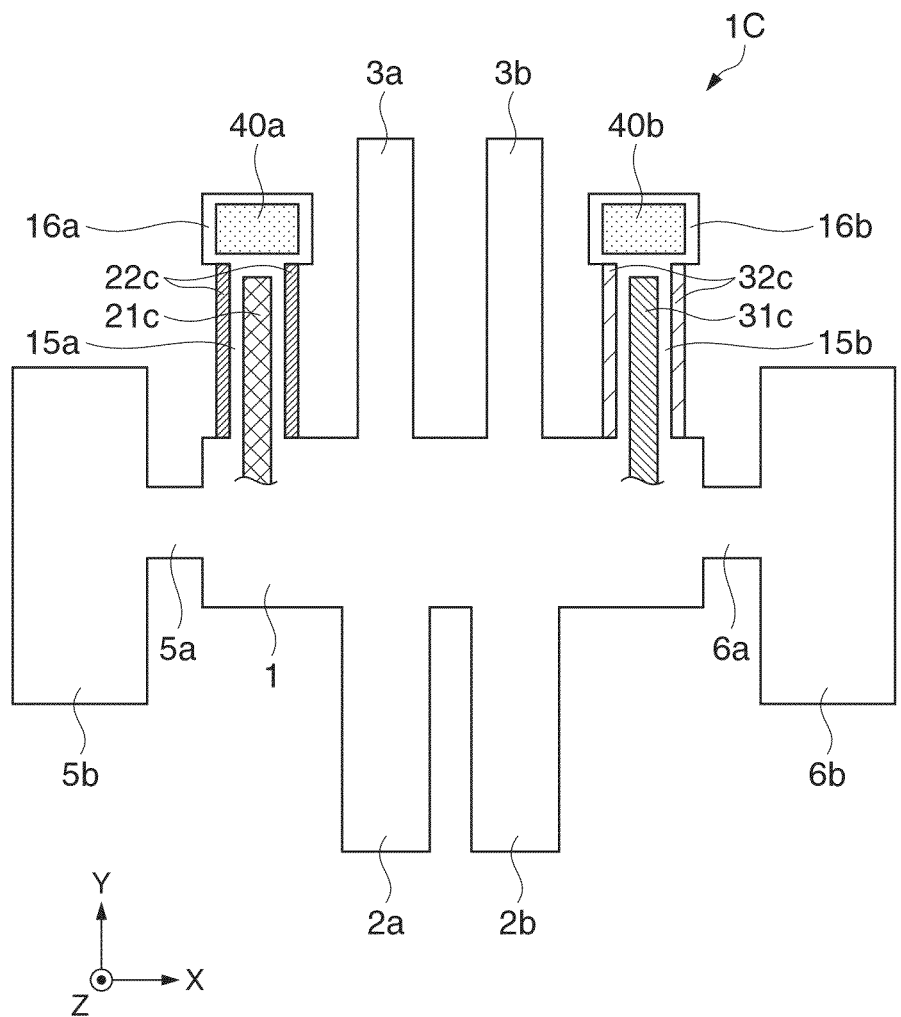
FIG. 4 is a plan view showing a configuration of another gyro element.

In the gyro element 10 according to the first embodiment described above, by applying shape modification making it possible to add a mass to the tip portion, the effect of the adjusting vibrating arms 4a, 4b of making a contribution to achieving high sensitivity of the gyro element 10 can further be enhanced. FIG. 4 is a schematic plan view showing a modified example of the gyro element as the vibrator element having a wide portion disposed at the tip of each of the adjusting vibrating arms as the second vibrating arms. It should be noted that in FIG. 4, the same constituents as those of the gyro element 10 according to the first embodiment will be denoted with the same reference symbols, and the explanation thereof will be omitted, and further the graphic description thereof will also be omitted.

As shown in FIG. 4, a gyro element 1C according to the present modified example has the base section 1, the pair of driving vibrating arms 2a, 2b and the pair of detecting vibrating arms 3a, 3b respectively extending from the both end portions in the Y-axis direction of the base section 1, each having the same configuration as that of the gyro element 10 according to the first embodiment. Further, the gyro element 1C has an adjusting vibrating arm 15a adjacent to the detecting vibrating arm 3a in the −X direction, and extending from the base section 1 in the +Y direction, and an adjusting vibrating arm 15b adjacent to the detecting vibrating arm 3b in the +X direction, and extending from the base section 1 in the +Y direction. The adjusting electrodes 21c, 31c as film members for adjusting the leakage output of the gyro element 1C are disposed on the primary surfaces of the adjusting vibrating arms 15a, 15b, and the adjusting electrodes 22c, 32c are disposed on the side surfaces of the adjusting vibrating arms 15a, 15b, respectively.

On the tip side of the adjusting vibrating arms 15a, 15b, there are disposed weight sections 16a, 16b as the wide portions having a roughly rectangular shape with a larger width (greater length in the X-axis direction) than the adjusting vibrating arms 15a, 15b, respectively. On the surfaces of the weight sections 16a, 16b, there are disposed film members 40a, 40b, respectively. It should be noted that the film members can be disposed on the both primary surfaces of the weight sections 16a, 16b, and further the both side surfaces although the graphic description thereof is omitted. Further, the film members 40a, 40b can be formed of the same metal material as that of the other electrodes, or can be formed of a non-conductive material. Since the film members 40a, 40b can simultaneously be formed together with the other electrodes by forming the film members 40a, 40b with the same metal material as that of the other electrodes, the productivity can be enhanced. Further, by forming the film members 40a, 40b with the non-conductive material, the number of choices of the film member forming material is advantageously increased. It should be noted that the material with the density as high as possible (with the specific weight as great as possible) is preferably used as the film member forming material.

According to the gyro element 1C related to the first modified example, since there are provided the adjusting vibrating arms 15a, 15b similarly to the adjusting vibrating arms 4a, 4b as the second vibrating arms explained in the gyro element 10 according to the first embodiment, the gyro element 1C with the leakage vibration suppressed can be obtained. Further, since the weight sections 16a, 16b as the wide portions are disposed on the tip side of the respective adjusting vibrating arms 15a, 15b, it is possible to enhance the leakage vibration suppressing effect while preventing increase in the length of the adjusting vibrating arms 15a, 15b. Further, since there can be provided a wide adjustable range of the weight of the film members (the electrodes) provided to the adjusting vibrating arms 15a, 15b for suppressing the leakage vibration, a fine adjustment for suppressing the leakage vibration becomes possible, and thus, the gyro element 1C with higher sensitivity can be provided.

Second Embodiment

Figure 5A:
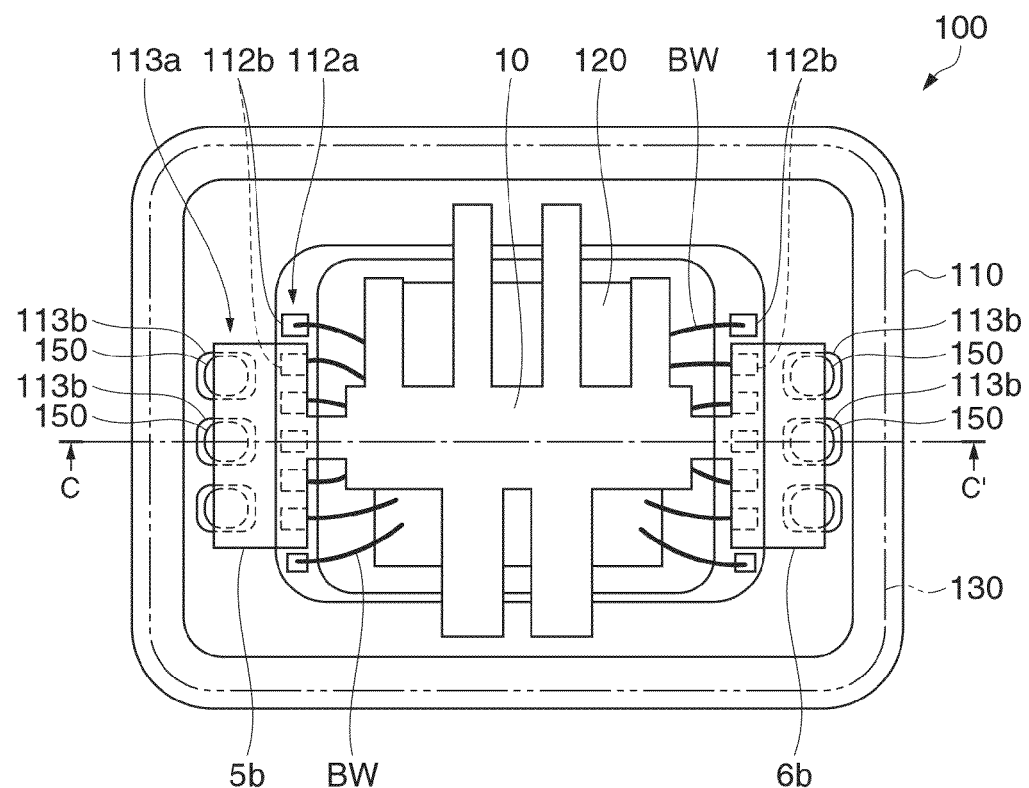
Figure 5B:
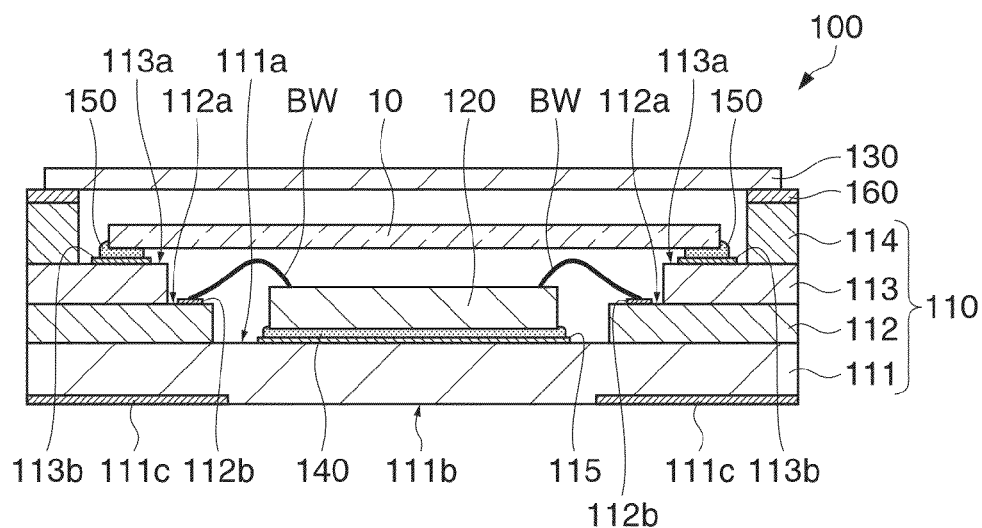

As the second embodiment, a gyro sensor as a sensor unit provided with the gyro element 10 according to the first embodiment will be explained. FIGS. 5A and 5B are diagrams showing a gyro sensor 100 according to the second embodiment of the invention, wherein FIG. 5A is a schematic plan view drawn with a lid member omitted, and FIG. 5B is a cross-sectional view of the C-C' section shown in FIG. 5A. It should be noted that the configuration of the present embodiment can be provided with a gyro element 510 described later.

As shown in FIG. 5B, the gyro sensor 100 has the gyro element 10 and a semiconductor device 120 as an electronic component housed in a recessed section of a package 110. An opening section of the package 110 is sealed with a lid member 130 to thereby keep the inside of the package 110 airtight. The package 110 is formed of a first substrate 111 having a planar shape, and a second substrate 112, a third substrate 113, and a fourth substrate 114 each having a frame-like shape stacked sequentially on the first substrate 111, fixed to each other to thereby form the recessed section in which the semiconductor device 120 and the gyro element 10 are housed. The first through fourth substrates 111, 112, 113, and 114 are formed of, for example, ceramics.

The first substrate 111 has a die pad 115 disposed on an electronic component installation surface 111a where the semiconductor device 120 on the recessed section side is mounted, and the semiconductor device 120 is mounted on and fixed to the die pad 115. The semiconductor device 120 is bonded to the surface of the die pad 115 with, for example, a brazing filler metal (die attaching material) 140, and fixed on the die pad 115.

The semiconductor device 120 has a drive circuit as an excitation device for driving the gyro element 10 to vibrate, and a detection circuit as a detector for detecting the detection vibration caused in the gyro element 10 upon application of the angular velocity. Specifically, the drive circuit provided to the semiconductor device 120 supplies drive signals to the driving electrodes 11a, 11b, 12c, and the driving electrodes 11c, 12a, and 12b respectively provided to the pair of driving vibrating arms 2a, 2b (see FIGS. 2A through 2D) of the gyro element 10. Further, the detection circuit provided to the semiconductor device 120 makes a detection signal generated in the detecting electrodes 21a, 21b, 22a, and 22b and the detecting electrodes 31a, 31b, 32a, and 32b respectively provided to the pair of detecting vibrating arms 3a, 3b (see FIGS. 2A through 2D) of the gyro element 10 be amplified to thereby generate an amplified signal, and then detects the rotational angular velocity applied to the gyro sensor 100 based on the amplified signal.

The second substrate 112 is formed to have a frame-like shape having an opening with a size sufficient for housing the semiconductor device 120 mounted on the die pad 115. The third substrate 113 is formed to have a frame-like shape having an opening larger than the opening of the second substrate 112, and is stacked on the second substrate 112 and fixed thereto. Further, a second substrate surface 112a appears inside the opening of the third substrate 113 when the third substrate 113 is stacked on the second substrate 112, and a plurality of IC connection terminals 112b are formed on the second substrate surface 112a. To the plurality of IC connection terminals, there are connected bonding wires BW electrically connected to electrode pads not shown of the semiconductor device 120. Further, the electrode pads not shown of the semiconductor device 120 and the IC connection terminals 112b provided to the package 110 are electrically connected to each other using a wire bonding method. In other words, the plurality of electrode pads provided to the semiconductor device 120 and the corresponding IC connection terminals 112b of the package 110 are connected to each other with the bonding wires BW. Further, some of the IC connection terminals 112b are electrically connected to a plurality of external connection terminals 111c disposed on an external bottom surface 111b of the first substrate 111 with internal wiring lines not shown of the package 110.

On the third substrate 113, there is stacked the fourth substrate 114 having an opening larger than the opening of the third substrate 113, and is fixed thereto. Further, a third substrate surface 113a appears inside the opening of the fourth substrate 114 when the fourth substrate 114 is stacked on the third substrate 113, and a plurality of gyro element connection terminals 113b are formed on the third substrate surface 113a. The plurality of gyro element connection terminals 113b are connected to the connection pads 11f, 12f, 21h, 22f, 31h, and 32f shown in FIGS. 2A through 2D provided to the gyro element 10. The gyro element connection terminals 113b are electrically connected to corresponding ones of the IC connection terminals 112b with internal wiring lines not shown of the package 110. Regarding the gyro element 10, the fixation sections 5b, 6b of the gyro element 10 are mounted on the third substrate surface 113a while aligning the positions of the connection pads 11f, 12f, 21h, 22f, 31h, and 32f and the positions of the gyro element connection terminals 113b with each other, and are then fixed by bonding with an electrically-conductive adhesive 150.

Further, the lid member 130 is disposed on the upper surface of the opening of the fourth substrate 114 to thereby seal the opening of the package 110, and thus the inside of the package 110 is sealed airtightly, and the gyro sensor 100 can be obtained. The lid member 130 can be formed using, for example, metal such as "42 alloy" (an iron-nickel alloy containing nickel 42%) or kovar (an alloy of iron, nickel, and cobalt), ceramics, or glass. For example, in the case of forming the lid member 130 with the metal, the lid member 130 is bonded to the package 110 by performing seam welding via a seal ring 160 formed by die-cutting the kovar alloy and so on so as to have a rectangular-ring shape. A recessed section space formed by the package 110 and the lid member 130 forms a space for the gyro element 10 to act, and is therefore preferably sealed airtightly to create a reduced-pressure space or an inert gas atmosphere.

In the gyro sensor 100, prior to performing the airtight seal with the lid member 130, the suppression adjustment of the leakage output of the gyro element 10 is performed. Firstly, the principle of a suppression adjustment method of the leakage output of the gyro element 10 will be explained. In the configuration in which the H-type vibrator element having the driving vibrating arms 2a, 2b and the detecting vibrating arms 3a, 3b respectively extending from the both end portion in the Y-axis direction of the base section 1 is provided with the adjusting vibrating arms 4a, 4b extending from the extending end portion of the detecting vibrating arms 3a, 3b of the base section 1 in the same direction as in the gyro element 10 (see FIGS. 1A and 1B), it is effective that the vibration direction of the leakage output is determined in accordance with a finished shape due to the tolerance of the etching process of each of the vibrating arms, and the adjustment for suppressing the leakage output is performed in accordance therewith.

Figure 6A:
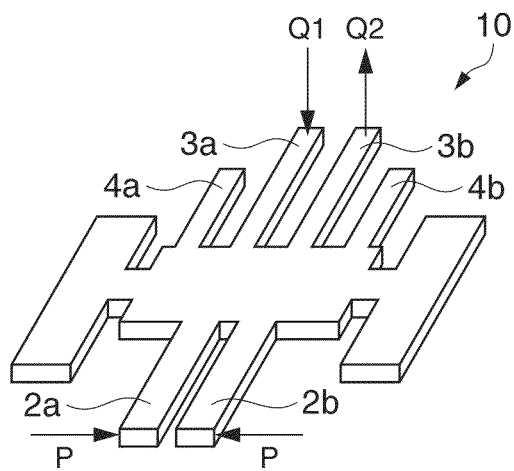
FIGS. 6A through 6C are explanatory diagrams showing a phase relationship between detecting vibrating arms out of first vibrating arms of the gyro element and adjusting vibrating arms as second vibrating arms thereof.
Figure 6B:
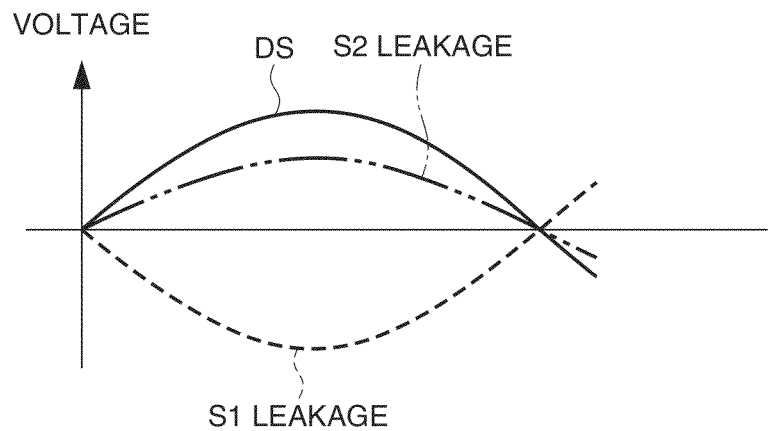
Figure 6C:
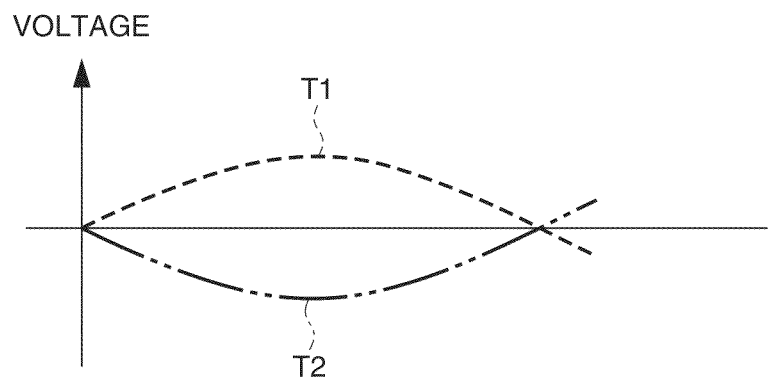

Specifically, when driving the gyro element 10, if the driving vibrating arms 2a, 2b move in the directions indicated by arrows P as shown in FIG. 6A, an output waveform DS of the driving vibrating arms 2a, 2b, and output waveforms S1 leakage, S2 leakage of the leakage output of the respective detecting vibrating arms 3a, 3b moving in the directions indicated by arrows Q1, Q2 exhibit waveforms shown in FIG. 6B. In order to cancel out such leakage output, it is necessary to set phases of the adjusting vibrating arms 4a, 4b to phases T1, T2 shown in FIG. 6C. In order to achieve the above, it is necessary to make the driving vibrating arms 2a, 2b and the adjusting vibrating arms 4a, 4b have phases reverse to each other.

Figure 7A:
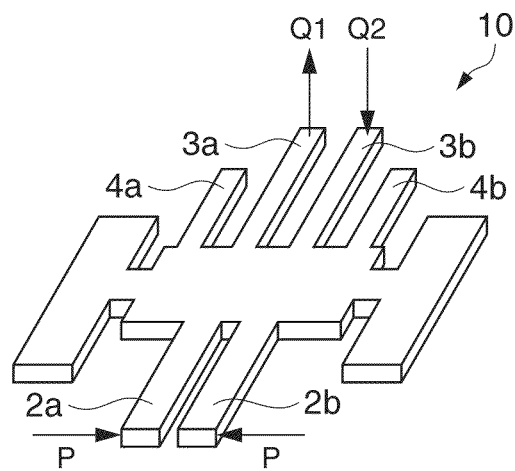
FIGS. 7A through 7C are explanatory diagrams showing a phase relationship between the detecting vibrating arms out of the first vibrating arms of the gyro element and the adjusting vibrating arms as the second vibrating arms thereof.
Figure 7B:
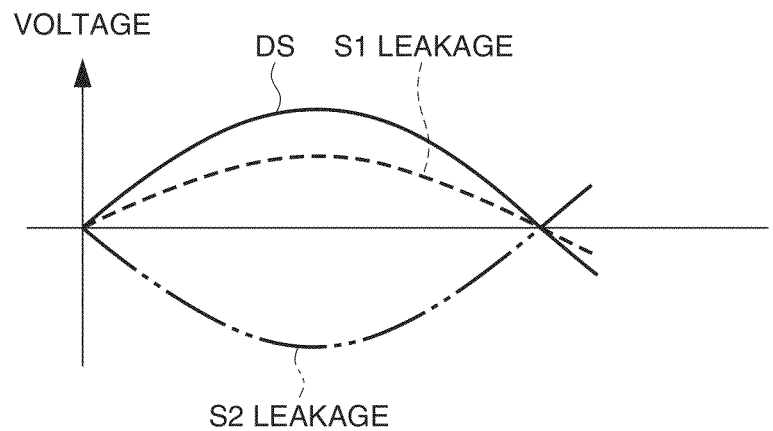
Figure 7C:
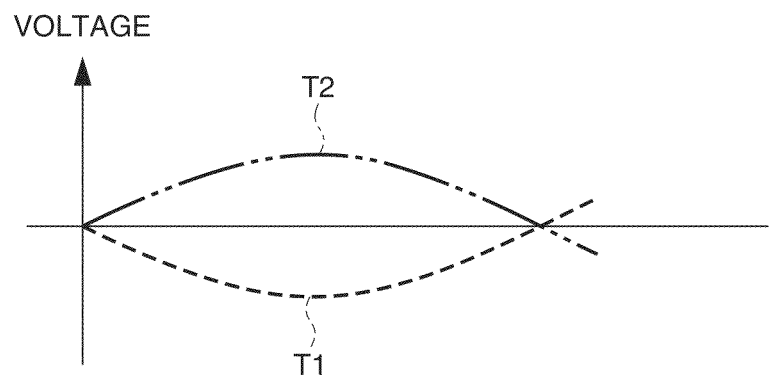

Further, when driving the gyro element 10, if the driving vibrating arms 2a, 2b move in the directions indicated by the arrows P as shown in FIG. 7A, the output waveform DS of the driving vibrating arms 2a, 2b, and the output waveforms S1 leakage, S2 leakage of the leakage output of the respective detecting vibrating arms 3a, 3b moving in the directions indicated by the arrows Q1, Q2 exhibit waveforms shown in FIG. 7B. In order to cancel out such leakage output, it is necessary to set the phases of the adjusting vibrating arms 4a, 4b to the phases T1, T2 shown in FIG. 7C. In order to achieve the above, it is necessary to make the driving vibrating arms 2a, 2b and the adjusting vibrating arms 4a, 4b have the same phase.

As described above, such vibration directions of the leakage output vary in accordance with the finished shape due to the tolerance of the manufacturing process of each of the vibrating arms. For example, even in the case of designing the vibrating arm having a rectangular cross-sectional shape, the cross-sectional shape may take a parallelogram shape, a trapezoidal shape, or a rhombic shape depending on the etching anisotropy of the quartz crystal as the base material, which affects the vibration directions of the leakage output. Here, assuming that the resonant frequency the driving vibrating arms 2a, 2b have is fd, and the resonant frequency the adjusting vibrating arms 4a, 4b have is ft, the following relationship between the case in which the phase of the driving vibrating arms 2a, 2b and the phase of the adjusting vibrating arms 4a, 4b are reverse to each other and the case in which the phase of the driving vibrating arms 2a, 2b and the phase of the adjusting vibrating arms 4a, 4b are the same in accordance with the relationship between the resonant frequencies fd, ft is true. That is:

if fd<ft, the phase of the driving vibrating arms 2a, 2b and the phase of the adjusting vibrating arms 4a, 4b are reverse to each other; and if fd>ft, the phase of the driving vibrating arms 2a, 2b and the phase of the adjusting vibrating arms 4a, 4b are the same.

Then, an example of the leakage output suppression adjustment method of the gyro element 10 taking the relationship between the various vibrating arms described above into consideration will be explained. Firstly, the resonant frequency is varied by decreasing or increasing the mass of the adjusting vibrating arms 4a, 4b by, for example, partially removing or attaching the film members provided to the adjusting vibrating arms 4a, 4b or cutting the substrates of the adjusting vibrating arms 4a, 4b, to thereby adjust the relationship between the resonant frequency fd of the driving vibrating arms 2a, 2b and the resonant frequency ft of the adjusting vibrating arms 4a, 4b to an appropriate relationship, and at the same time perform the suppression adjustment of the leakage output. Specifically, the mass of the adjusting vibrating arms 4a, 4b is decreased or increased by trimming the adjusting electrodes 21c, 21d, 22c, 31c, 31d, and 32c as the film members provided to the adjusting vibrating arms 4a, 4b by, for example, laser irradiation, or attaching film members the same as or different from the adjusting electrodes 21c, 21d, 22c, 31c, 31d, and 32c by vapor deposition or sputtering. By increasing or decreasing the mass, the phase adjustment for varying the resonant frequency to thereby adjust the relationship between fd and ft with respect to the phases to a desired relationship (fd<ft or fd>ft), and suppression of the influence of the leakage output to the minimum level by decreasing or increasing the amount of the charge are performed. It should be noted that in this case, the adjusting electrodes 21c, 21d, 22c, 31c, 31d, and 32c of the adjusting vibrating arms 4a, 4b and the detecting electrodes 21a, 21b, 22a, 22b, 31a, 31b, 32a, and 32b of the detecting vibrating arms 3a, 3b are electrically connected to each other.

As described hereinabove, in the method of leakage output suppression adjustment according to the present embodiment, by partially removing or attaching the adjusting electrodes 21c, 21d, 22c, 31c, 31d, and 32c of the adjusting vibrating arms 4a, 4b to thereby adjust the relationship between the resonant frequency fd of the driving vibrating arms 2a, 2b and the resonant frequency ft of the adjusting vibrating arms 4a, 4b to an appropriate relationship, and at the same time, vary the charge amount, the fine adjustment of the leakage output can be performed. It should be noted that in the case of, for example, the gyro element 1C shown in the modified example having the weight section as the wide portion in each of the adjusting vibrating arms 4a, 4b, the mass of the weight sections 16a, 16b is firstly decreased or increased by trimming the film members 40a, 40b of the weight sections 16a, 16b as the wide portions disposed at the tip portions of the adjusting vibrating arms 15a, 15b by, for example, the laser irradiation, or attaching film members the same as or different from the film members 40a, 40b by vapor deposition or sputtering. By increasing or decreasing the mass, the phase adjustment for varying the resonant frequency to thereby adjust the relationship between fd and ft with respect to the phases to a desired relationship (fd<ft or fd>ft).

After performing the phase adjustment described above, the suppression adjustment of the leakage output is then performed. Specifically, by decreasing or increasing the charge amount by partially removing the adjusting electrodes 21c, 21d, 22c, 31c, 31d, and 32c provided to the adjusting vibrating arms 15a, 15b by, for example, laser irradiation, or attaching the metal for the electrode by vapor deposition, sputtering, and so on, the influence of the leakage output is suppressed to the minimum level.

Here, the fact that "TuX" mode vibration can be avoided since the driving vibrating arms 2a, 2b and the adjusting vibrating arms 4a, 4b extend from the base section 1 in the respective directions opposite to each other will be explained with reference to FIGS. 8A through 8D. FIGS. 8A through 8D are schematic diagrams showing the vibration modes of the gyro element for explaining the "TuX" mode vibration. FIGS. 8A and 8B are diagrams showing the vibration mode of a gyro element in a comparative example, the FIGS. 8C and 8D are diagrams showing the vibration mode of the gyro element according to the embodiment of the invention.

In FIGS. 8A and 8B, the vibration mode of a gyro element 1010 as the comparative example will be explained. The gyro element 1010 has a pair of driving vibrating arms 1002a, 1002b, and a pair of adjusting vibrating arms 1004a, 1004b having the driving vibrating arms 1002a, 1002b therebetween disposed on one end of a base section 1001, and a pair of detecting vibrating arms 1003a, 1003b disposed on the other end of the base section 1001. Further, at both ends of the base section 1001 in a direction intersecting with the one end and the other end described above, there are disposed a first support section 1005 and a second support section 1006.

As shown in FIG. 8A, in a normal vibration mode of the gyro element 1010, the driving vibrating arm 1002a and the driving vibrating arm 1002b move in the respective directions opposite to each other (a vibration direction f1 of the driving vibrating arm 1002a and a vibration direction f2 of the driving vibrating arm 1002b are reversed (in reverse phases) to each other), and the adjusting vibrating arm 1004a and the adjusting vibrating arm 1004b move in the respective directions opposite to each other (a vibration direction e1 of the adjusting vibrating arm 1004a and a vibration direction e2 of the adjusting vibrating arm 1004b are reversed (in reverse phases) to each other). On this occasion, the driving vibrating arm 1002a and the adjusting vibrating arm 1004a adjacent to each other move in the same direction (the vibration directions f1, e1 of the driving vibrating arm 1002a and the adjusting vibrating arm 1004a adjacent to each other are the same). Similarly, the driving vibrating arm 1002b and the adjusting vibrating arm 1004b adjacent to each other move in the same direction (the vibration directions f2, e2 of the driving vibrating arm 1002b and the adjusting vibrating arm 1004b adjacent to each other are the same). It should be noted that in the vibration in the reverse direction to the above, the corresponding vibrating arms similarly swing in the same direction (the in-phase direction). Due to the vibration in such a vibration mode (Tu mode vibration, a so-called tuning-fork vibration), vibration vectors (motion vectors) in the driving vibrating arms 1002a, 1002b and the adjusting vibrating arms 1004a, 1004b are balanced, and the stable vibration is achieved.

However, since the shape of, for example, each of the vibrating arms and the extending portion of the vibrating arm from the base section 1001 varies due to the manufacturing tolerance in the manufacturing process of the gyro element 1010 and so on, a vibration mode (the "TuX" mode vibration) departing from the stable vibration mode described above appears. The "TuX" mode vibration will be explained with reference to FIG. 8B. It should be noted that the constituents of the gyro element 1010 are the same as shown in FIG. 8A, and will therefore be denoted with the same reference numerals, and the explanation therefor will be omitted.

In the "TuX" mode vibration, the respective vibrating arms of the pair of driving vibrating arms 1002a, 1002b move in the same (in-phase) direction, and the respective vibrating arms of the pair of adjusting vibrating arms 1004a, 1004b move in the same (in-phase) direction. In the detailed explanation along FIG. 8B, the driving vibrating arm 1002a moves in a vibration direction f3, and the other driving vibrating arm 1002b moves in a vibration direction f4. In other words, the pair of driving vibrating arms 1002a, 1002b move in the same (in-phase) direction. Further, the adjusting vibrating arm 1004a moves in a vibrating direction e3, and the other adjusting vibrating arm 1004b moves in a vibrating direction e4. In other words, the pair of adjusting vibrating arms 1004a, 1004b move in the same (in-phase) direction. If such a "TuX" mode vibration occurs, the balance of the vibration vectors (the motion vectors) of the driving vibrating arms 1002a, 1002b and the adjusting vibrating arms 1004a, 1004b is destroyed, and as a result, generation of the leakage vibration is enhanced.

In contrast to the comparative example described above, since the gyro element 10 according to the embodiment of the invention has the driving vibrating arms 2a, 2b and the adjusting vibrating arms 4a, 4b extending from the base section 1 in the respective directions opposite to each other, it becomes possible to suppress the influence of the "TuX" mode vibration appearing therein, if any. Here, detailed explanations will be presented with reference to FIGS. 8C and 8D. The gyro element 10 has the pair of detecting vibrating arms 3a, 3b, and the pair of adjusting vibrating arms 4a, 4b having the detecting vibrating arms 3a, 3b therebetween disposed on one end of the base section 1, and the pair of driving vibrating arms 2a, 2b disposed on the other end of the base section 1. Further, at both ends of the base section 1 in the direction intersecting with the one end and the other end described above, there are disposed the first support section 5 and the second support section 6.

As shown in FIG. 8C, in the normal vibration mode of the gyro element 10, the driving vibrating arm 2a and the driving vibrating arm 2b move in the respective directions opposite to each other (vibration direction f5 of the driving vibrating arm 2a and vibration direction f6 of the driving vibrating arm 2b are reversed (in reverse phases) to each other), and the adjusting vibrating arm 4a and the adjusting vibrating arm 4b move in the respective directions opposite to each other (a vibration direction e5 of the adjusting vibrating arm 4a and a vibration direction e6 of the adjusting vibrating arm 4b are reversed (in reverse phases) to each other). It should be noted that in the vibration in the reverse direction to the above, the corresponding vibrating arms similarly swing in the same direction (the in-phase direction). Even in the case of the present embodiment in which the driving vibrating arms 2a, 2b and the adjusting vibrating arms 4a, 4b are disposed on the opposite sides across the base section 1, due to the vibration in such a vibration mode (the Tu mode vibration, a so-called tuning-fork vibration), the vibration vectors (the motion vectors) in the driving vibrating arms 2a, 2b and the adjusting vibrating arms 4a, 4b are balanced, and the stable vibration is achieved.

As explained above, since the shape of, for example, each of the vibrating arms and the extending portions of the vibrating arms from the base section 1 varies due to the manufacturing tolerance in the manufacturing process of the gyro element 10 and so on, the vibration mode (the "TuX" mode vibration) departing from the stable vibration mode described above appears similarly in the present embodiment. However, by using the configuration of the gyro element 10 according to the present embodiment, it becomes possible to reduce the influence of the "TuX" mode vibration occurring therein, if any. The mechanism thereof will be explained with reference to FIG. 8D. It should be noted that the constituents of the gyro element 10 are the same as shown in FIG. 8C, and will therefore be denoted with the same reference numerals, and the explanation therefor will be omitted.

Firstly, the "TuX" mode vibration of the gyro element 10 in the present embodiment will be explained along FIG. 8D. In the "TuX" mode vibration, the respective vibrating arms of the pair of driving vibrating arms 2a, 2b move in the same (in-phase) direction, and the respective vibrating arms of the pair of adjusting vibrating arms 4a, 4b move in the same (in-phase) direction. In the detailed explanation, the driving vibrating arm 2a moves in a vibrating direction f7, and the other driving vibrating arm 2b moves in a vibrating direction f8. In other words, the pair of driving vibrating arms 2a, 2b move in the same (in-phase) direction. Further, the adjusting vibrating arm 4a moves in a vibrating direction e7, and the other adjusting vibrating arm 4b moves in a vibrating direction e8. In other words, the pair of adjusting vibrating arms 4a, 4b move in the same (in-phase) direction. On this occasion, the driving vibrating arms 2a, 2b and the adjusting vibrating arms 4a, 4b move in the respective directions opposite to each other (the vibration directions f7, f8 of the driving vibrating arms 2a, 2b and the vibration directions e7, e8 of the adjusting vibrating arms 4a, 4b are reverse to each other). If such a "TuX" mode vibration occurs, a rotational force centered on the center of the base section 1 occurs due to the vibration vectors (the motion vectors) of the driving vibrating arms 2a, 2b and the adjusting vibrating arms 4a, 4b.

However, in the gyro element 10 according to the present embodiment, since the base section 1 is fixed with the first support section 5 and the second support section 6 disposed at the both ends of the base section 1, there occurs the state in which the base section 1 is fixed in a pseudo manner, and it becomes difficult for the rotational force to affect each of the vibrating arms (the driving vibrating arms 2a, 2b and the adjusting vibrating arms 4a, 4b). In other words, by suppressing the rotational force by fixing the first support section 5 and the second support section 6, only the frequency in the "TuX" mode is significantly lowered to thereby make it possible to take the frequency in the "TuX" mode away from the drive frequency. Due to the mechanism described above, in the configuration of the gyro element 10, the coupling (generation) in the "TuX" mode can be avoided (the frequency in the "TuX" mode can be taken away from the drive frequency), and as a result, the leakage output of the vibration can be suppressed, and thus it becomes possible to continue the stable vibration.

It should be noted that substantially the same advantage can be obtained even in the configuration having the first fixation section 5b and the second fixation section 6b having the shape of the fixation section 7 or 8 having a frame-like shape and connected to the base section 1 with the connection sections 5a, 6a as the gyro element 1A or the gyro element 1B explained with reference to FIGS. 3A and 3B.

After performing the suppression adjustment of the leakage output, the fine adjustment of the frequency of the gyro element 10 bonded to the package 110 is performed. The frequency adjustment can be performed by a method of decreasing the mass by partially removing the electrode of the gyro element 10 using laser trimming, a method of attaching the mass to the gyro element 10 using vapor deposition, sputtering, and so on, a method of rewriting data of the semiconductor device 120, or the like.

Gyro Element According to Third Embodiment

Figure 9A:
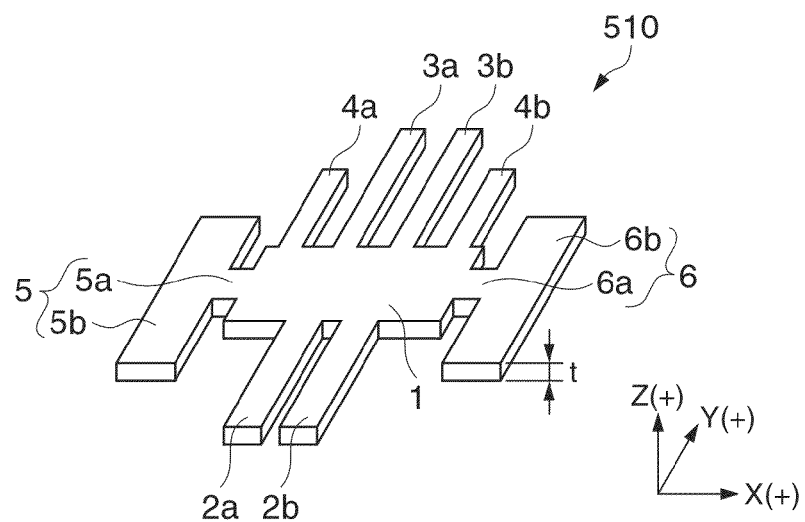
Figure 9B:
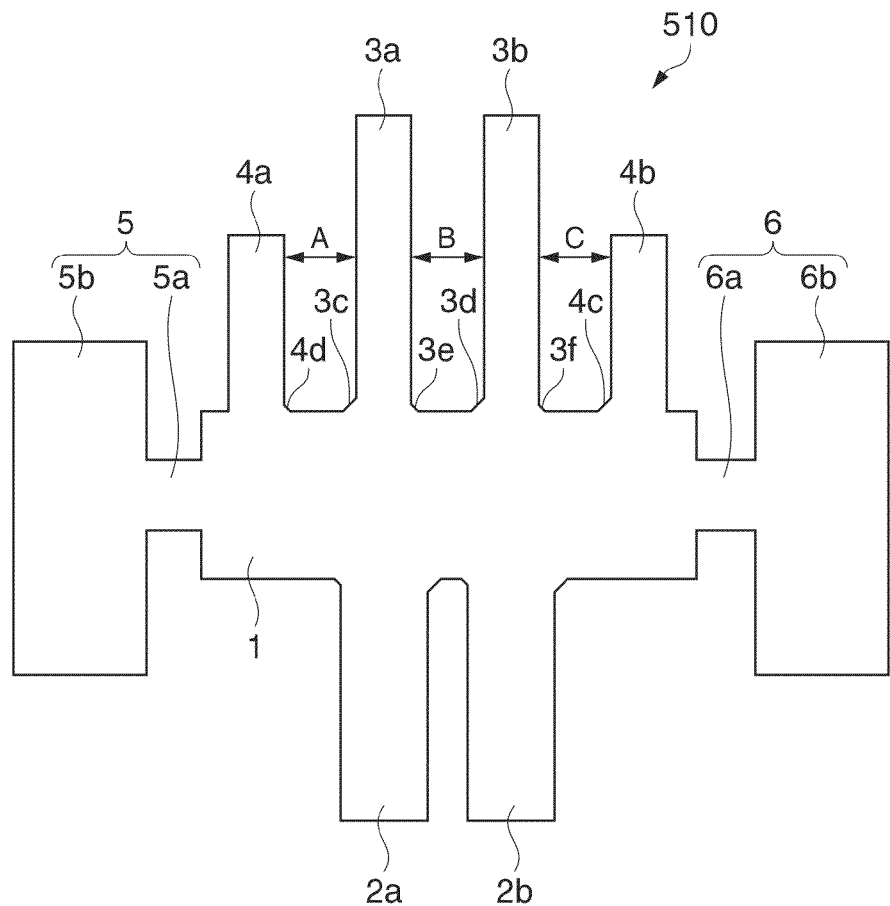

Then, a third embodiment in which a vibrator element according to the invention is embodied as a vibration gyro element will be explained. FIGS. 9A and 9B are diagrams showing an example of the vibration gyro element as the vibrator element, wherein FIG. 9A is a perspective view showing it schematically, and FIG. 9B is a plan view showing it schematically. As shown in FIG. 9A, a vibration gyro element 510 (hereinafter referred to as a gyro element 510) as the vibrator element has a base section 1 integrally formed by processing a base material (a material constituting an essential part), driving vibrating arms 2a, 2b and detecting vibrating arms 3a, 3b, and adjusting vibrating arms 4a, 4b. Further, a first support section 5 is formed of a first connection section 5a extending from the base section 1 and a first fixation section 5b connected to the first connection section 5a and to be fixed to a substrate such as a package not shown, and a second support section 6 is formed of a second connection section 6a extending from the base section 1 and a second fixation section 6b connected to the second connection section 6a and to be fixed to the substrate such as the package not shown.

An example of the gyro element 510 according to the present embodiment using quartz crystal, which is a piezoelectric material, as the base material will be explained. The quartz crystal has an X axis called an electrical axis, a Y axis called a mechanical axis, and a Z axis called an optical axis. In the present embodiment, there is explained an example of using a so-called quartz crystal Z plate as the base material. The quartz crystal Z plate is carved out along a plane defined by the X axis and the Y axis perpendicular to each other in the crystal axes of the quartz crystal, then processed to have a plate-like shape, and has a predetermined thickness t in the Z-axis direction perpendicular to the plane. It should be noted that the predetermined thickness t mentioned here is appropriately set in accordance with the oscillation frequency (resonant frequency), the outside dimension, the workability, and so on. Further, the plate forming the gyro element 510 can allow the error in the angle, at which the plate is carved out from the quartz crystal, in some range with respect to each of the X axis, Y axis, and Z axis. For example, it is possible to use the plate carved out after being rotated in a range of 0 through 2 degrees around the X axis. The same applies to the Y axis and the Z axis.

The gyro element 510 has the base section 1 having a roughly rectangular shape and located at a central portion, the pair of driving vibrating arms 2a, 2b extending in parallel to each other from one (an end portion in the −Y direction in the drawing) of end portions in the Y-axis direction of the base section 1 along the Y axis, and the pair of detecting vibrating arms 3a, 3b extending in parallel to each other with a distance B from the other (an end portion in the +Y direction) of the end portions of the base section 1 along the Y axis. As described above, the pair of driving vibrating arms 2a, 2b and the pair of detecting vibrating arms 3a, 3b respectively extend from the both end portions of the base section 1 in the same axis directions. Due to such a shape as described above, the gyro element 510 according to the present embodiment may sometimes be called an H-type vibrator element (an H-type gyro element). Since the driving vibrating arms 2a, 2b and the detecting vibrating arms 3a, 3b respectively extend from the both end portions in the same axis directions of the base section 1, a drive system and a detection system are separated from each other to thereby reduce the capacitive coupling between electrodes or wiring lines of the drive system and the detection system, and therefore the H-type gyro element 510 has a feature that the detection sensitivity is stabilized. It should be noted that although the pair of driving vibrating arms and the pair of detecting vibrating arms are provided in the present embodiment taking the H-type vibrator element as the example, the number of vibrating arms can also be one or more than two. Further, it is also possible to provide a driving electrode and a detecting electrode to one vibrating arm.

Further, the gyro element 510 has the pair of adjusting vibrating arms 4a, 4b extending from the base section 1 in a direction intersecting with the crystal X axis (the electrical axis) of the quartz crystal in parallel to the detecting vibrating arms 3a, 3b so as to have the detecting vibrating arms 3a, 3b therebetween. In other words, the adjusting vibrating arms 4a, 4b extend along the Y axis in the +Y direction. Further, the one adjusting vibrating arm 4a has a distance A with the adjacent detecting vibrating arm 3a, and the other adjusting vibrating arm 4b has a distance C with the adjacent detecting vibrating arm 3b. Further, the adjusting vibrating arms 4a, 4b and the detecting vibrating arms 3a, 3b are formed so that the relationship between the distance A, the distance C, the distance B between the pair of detecting vibrating arms 3a, 3b, and the thickness t of the base material satisfies the following.

$B<t,$ $B\times 0.8<A<B\times 1.2,$ and $B\times 0.8<C<B\times 1.2$

Further, the adjusting vibrating arms 4a, 4b are formed to have a length smaller than the lengths of the driving vibrating arms 2a, 2b and the detecting vibrating arms 3a, 3b. Thus, since the vibration of the adjusting vibrating arms 4a, 4b for adjusting a leakage output does not hinder the primary vibration of the gyro element 510 by the driving vibrating arms 2a, 2b and the detecting vibrating arms 3a, 3b, the vibration characteristics of the gyro element 510 are stabilized, and at the same time an advantageous effect to the miniaturization of the gyro element 510 can be obtained.

The center of the base section 1 can be the center of gravity of the gyro element 510. Further, it is assumed that the X axis, the Y axis, and the Z axis are perpendicular to each other, and pass through the center of gravity. The outer shape of the gyro element 510 can be axisymmetric about an imaginary center line in the Y-axis direction passing through the center of gravity. Thus, the gyro element 510 has a well-balanced outer shape, and the characteristics of the gyro element 510 are stabilized to thereby preferably enhance the detection sensitivity. Such an outer shape of the gyro element 510 can be formed by etching (wet etching or dry etching) using a photolithography technology. It should be noted that a plurality of such gyro elements 510 can be obtained from a single quartz crystal wafer.

Further, as described above, the following advantages can be obtained by disposing the adjusting vibrating arms 4a, 4b and the detecting vibrating arms 3a, 3b so that the relationship between the distance A, the distance C, the distance B between the pair of detecting vibrating arms 3a, 3b, and the thickness t of the base material satisfies the following.

$B<t,$ $B\times 0.8<A<B\times 1.2,$ and $B\times 0.8<C<B\times 1.2$

As described above, by forming the distance A and the distance C between the detecting vibrating arms 3a, 3b and the adjacent ones of the adjusting vibrating arms 4a, 4b taking the distance B between the pair of arms of the detecting vibrating arms 3a, 3b as a reference, it becomes possible to stably form the outer shapes of connection sections between the base section 1, and the detecting vibrating arms 3a, 3b and the adjusting vibrating arms 4a, 4b.

Here, a relationship between the formation of the outer shape of the gyro element 510 and the vibration characteristics thereof will be explained in detail. If the outer shape of the gyro element 510 is formed by the etching process using the photolithography technology, etching residues (also referred to as fins) 3c, 3d, 3e, 3f, 4c, and 4d are generated in the connection sections (corner portions) between the base section 1, and the detecting vibrating arms 3a, 3b and the adjusting vibrating arms 4a, 4b due to the etching anisotropy of quartz crystal.

The sizes of the etching residues 3c, 3d, 3e, 3f, 4c, and 4d are different depending on the root positions of the respective vibrating arms due to the etching anisotropy of quartz crystal. For example, in the detecting vibrating arm 3a, the etching residue 3c generated on the left side (the side facing the adjusting vibrating arm 4a) of the root in the drawing is larger than the etching residue 3e generated on the right side (the side facing the detecting vibrating arm 3b) of the root in the drawing. Similarly, in the detecting vibrating arm 3b, the etching residue 3d generated on the left side (the side facing the detecting vibrating arm 3a) of the root in the drawing is larger than the etching residue 3f generated on the right side (the side facing the adjusting vibrating arm 4b) of the root in the drawing. Further, the etching residue 4d is similarly generated on the right side (the side facing the detecting vibrating arm 3a) of the root of the adjusting vibrating arm 4a in the drawing, and is smaller than the etching residue 3c generated in the root of the adjacent detecting vibrating arm 3a on the side facing the adjusting vibrating arm 4a. Further, the etching residue 4c is similarly generated on the left side (the side facing the detecting vibrating arm 3b) of the root of the adjusting vibrating arm 4b in the drawing, and is larger than the etching residue 3f generated in the root of the adjacent detecting vibrating arm 3b on the side facing the adjusting vibrating arm 4b.

Such a phenomenon prominently appears in the case in which the thickness t of the base material is large (thick) requiring a particularly long etching processing time, namely the case in which the thickness t of the base material is larger (thicker) than the distance B between the pair of arms of the detecting vibrating arms 3a, 3b, the case in which the distance (the distances A, B, and C described above) between the vibrating arms adjacent to each other is narrow, and so on. It should be noted that although it is also effective in the case in which the thickness t of the base material is smaller (thinner) than the distance B between the pair of arms of the detecting vibrating arms 3a, 3b, in this case, the etching processing time is short, and the etching residues 3c, 3d, 3e, 3f, 4c, and 4d are relatively small, and therefore, the vibration characteristics are hardly affected. Further, since the etching residues generated in the roots of the vibrating arms adjacent to each other (opposed to each other) are different in size (are varied in the outer shape), the vibration frequency or the vibration mode is slightly different between the vibrating arms. Due to the difference, the balance of the vibrations of the respective vibrating arms is destroyed, and it becomes easy to cause the vibration leakage output, the unwanted mode vibration (the TuX mode vibration), or the like.

In the gyro element 510 according to the present embodiment, if the relationship between the distance B between the pair of detecting vibrating arms 3a, 3b and the thickness t of the base material fulfills B<t, the relationship between the distance A between the one adjusting vibrating arm 4a and the adjacent detecting vibrating arm 3a, the distance C between the other adjusting vibrating arm 4b and the adjacent detecting vibrating arm 3b, and the distance B between the pair of detecting vibrating arms 3a, 3b satisfies the following.

$$B \times 0.8 < A < B \times 1.2, \text{ and}$$

$$B \times 0.8 < C < B \times 1.2$$

Thus, it becomes possible to provide the stable shapes to the etching residues 3c, 3d, 3e, 3f, 4c, and 4d formed in the roots of the respective vibrating arms. Therefore, it becomes possible to suppress the vibration leakage output or the unwanted mode vibration (the TuX mode vibration) caused by the large etching residues formed in the roots of the respective vibrating arms or the variation in the shape of the etching residue, and thus the vibration characteristics of the vibrator element can be stabilized. Therefore, the highly sensitive and highly accurate vibrator element can be obtained.

It should be noted that it is also possible to set the distances A, C to be equal to or larger than a value 1.2 times of the distance B, but it is impractical because the outer shape of the gyro element 510 grows in size to make it unachievable to satisfy the requirement of miniaturization.

It should be noted that regarding the electrode arrangement and the other functions of the gyro element 510, since the configuration is substantially the same as that of the first embodiment described above, the explanation thereof in the present embodiment will be omitted.

As described above, according to the gyro element 510 related to the present embodiment, if an angular velocity is applied to the gyro element 510 in the state in which the driving vibrating arms 2a, 2b are vibrated by applying a predetermined excitation drive signal, the vibration due to the Coriolis force is caused in the detecting vibrating arms 3a, 3b. Due to the vibration of the detecting vibrating arms 3a, 3b, the adjusting vibrating arms 4a, 4b are excited. Therefore, by varying the charge amount by increasing or decreasing the weight of the adjusting electrodes 21c, 21d, 22c, 31c, 31d, and 32c as a metal film provided to the adjusting vibrating arms 4a, 4b or increasing or decreasing the volume of the adjusting electrodes 21c, 21d, 22c, 31c, 31d, and 32c, it is possible to suppress the unwanted leakage output of the detecting vibrating arms 3a, 3b.

Therefore, it is possible to suppress the degradation of the detection sensitivity caused by the leakage output, which can occur due to the variation in the cross-sectional shape of the driving vibrating arms 2a, 2b and the detecting vibrating arms 3a, 3b caused by the etching anisotropy of the quartz crystal as the base material of the gyro element 510 and the production tolerance, and thus, it is possible to provide the gyro element 510 as a vibrator element with high sensitivity.

It should be noted that although in the explanation of the gyro element according to the embodiment described above there is used the example in which the pair of detecting vibrating arms 3a, 3b, and the pair of adjusting vibrating arms 4a, 4b having the detecting vibrating arms 3a, 3b therebetween are disposed on one end of the base section 1, and the pair of driving vibrating arms 2a, 2b are disposed on the other end of the base section 1, the invention is not limited to this configuration. For example, the configuration in which the driving vibrating arms and the adjusting vibrating arms extend from the same end of the base section in the same direction can also be adopted. In the detailed description, the gyro element is provided with the pair of driving vibrating arms and the pair of adjusting vibrating arms having the driving vibrating arms therebetween disposed at one end of the base section, and is provided with the pair of detecting vibrating arms disposed at the other end of the base section.

Such a configuration can be applied to the gyro element according to embodiments and modified examples explained hereinafter.

Figure 10A:
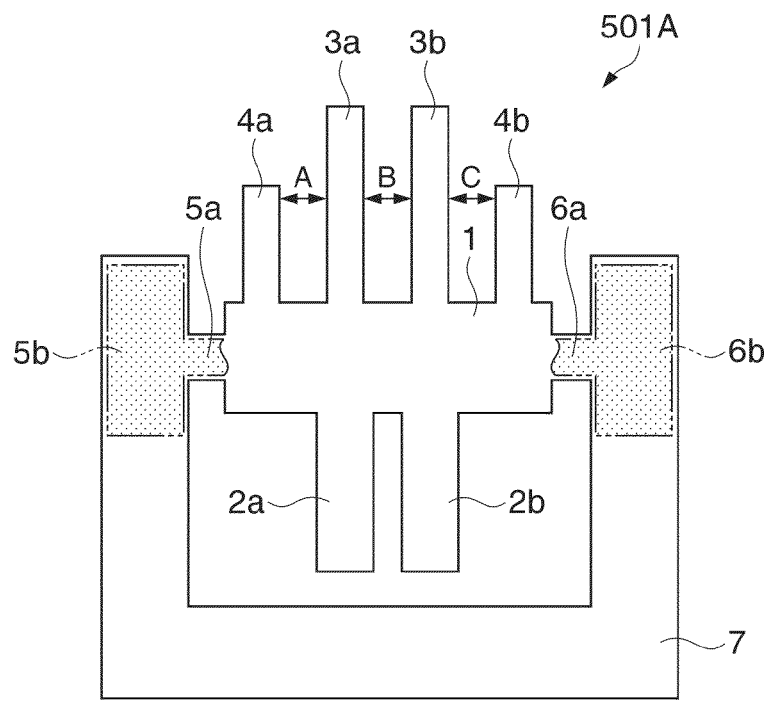
FIGS. 10A and 10B are schematic plan views showing configurations of other gyro elements.
Figure 10B:
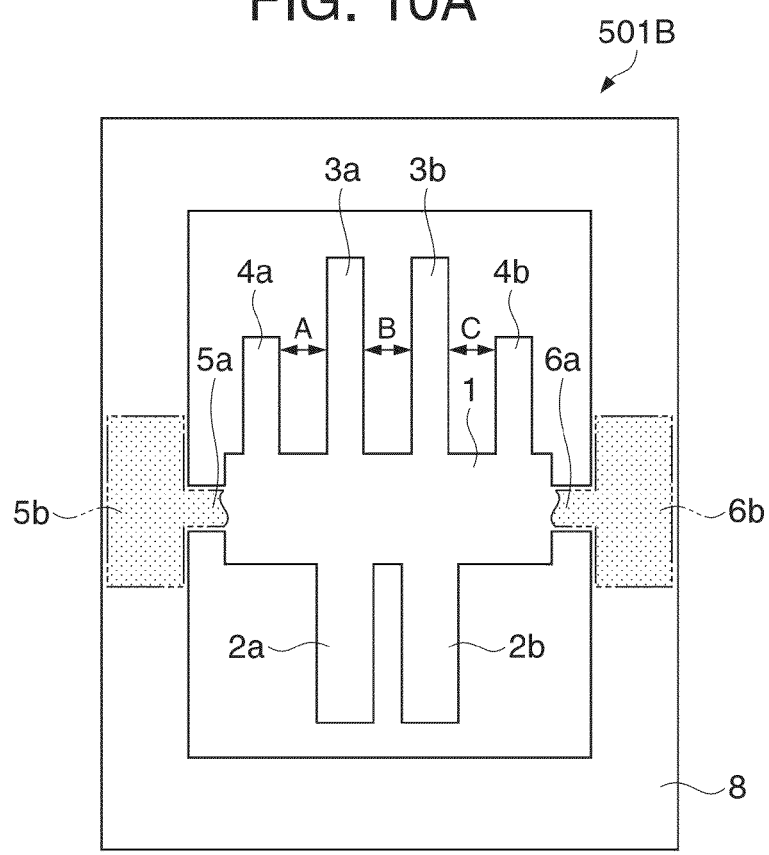

FIGS. 10A and 10B are plan views showing other configurations of the gyro element 510 according to the third embodiment. In a gyro element 501A shown in FIG. 10A, a fixation section 7 connected to the base section 1 with the first connection section 5a and the second connection section 6a has a frame-like shape. Specifically, there is formed the fixation section 7 composed of the first fixation section 5b and the second fixation section 6b in the gyro element 510 according to the third embodiment integrally connected to each other on the driving vibrating arms 2a, 2b side in the present embodiment. It should be noted that in also the gyro element 501A, the one adjusting vibrating arm 4a has the distance A with the adjacent detecting vibrating arm 3a, and the other adjusting vibrating arm 4b has the distance C with the adjacent detecting vibrating arm 3b. Further, the adjusting vibrating arms 4a, 4b and the detecting vibrating arms 3a, 3b are formed so that the relationship between the distance A, the distance C, the distance B between the pair of detecting vibrating arms 3a, 3b, and the thickness t of the base material satisfies the following.

$B<t$, $B\times 0.8 < A < B\times 1.2$, and $B\times 0.8 < C < B\times 1.2$

Further, a gyro element 501B shown in FIG. 10B has a configuration in which the base section 1, the driving vibrating arms 2a, 2b, the detecting vibrating arms 3a, 3b, and the adjusting vibrating arms 4a, 4b are disposed inside a fixation section 8 having a frame-like shape, and the base section 1 and the fixation section 8 are connected to each other via the first connection section 5a and the second connection section 6a. It should be noted that in also the gyro element 501B, the one adjusting vibrating arm 4a has the distance A with the adjacent detecting vibrating arm 3a, and the other adjusting vibrating arm 4b has the distance C with the adjacent detecting vibrating arm 3b. Further, the adjusting vibrating arms 4a, 4b and the detecting vibrating arms 3a, 3b are formed so that the relationship between the distance A, the distance C, the distance B between the pair of detecting vibrating arms 3a, 3b, and the thickness t of the base material satisfies the following.

$B<t$, $B\times 0.8 < A < B\times 1.2$, and $B\times 0.8 < C < B\times 1.2$

As described above, according to the gyro elements 501A, 501B shown in FIGS. 10A and 10B, by adopting the fixation section 7 or the fixation section 8 with a large fixation area to be fixed to the package to thereby increase the fixation force when forming a gyro unit housing the gyro element 501A or 501B in the package described later, the vibration leakage to the package can be suppressed in addition to the advantages explained with respect to the gyro element 510 described above. Further, since the fixation section 7 or the fixation section 8 has the frame-like shape, it is possible to increase the strength of the gyro element 501A, 501B to thereby suppress the vibration leakage to the fixation section 7 or the fixation section 8.

Modified Example

Figure 11:
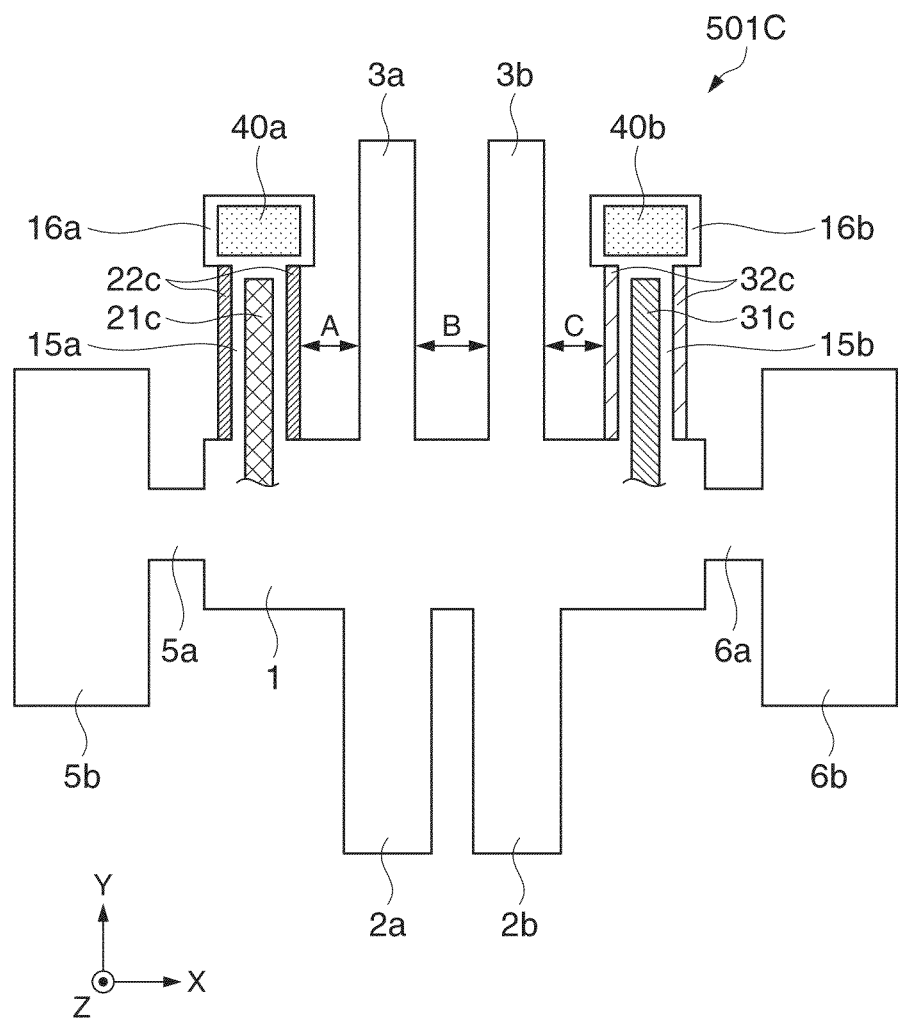
FIG. 11 is a schematic plan view showing a configuration of another gyro element.

In the gyro element 510 according to the third embodiment described above, by applying shape modification making it possible to add a mass to tip portions, the effect of the adjusting vibrating arms 4a, 4b of making a contribution to achieving high sensitivity of the gyro element 510 can further be enhanced. FIG. 11 is a schematic plan view showing a modified example of the gyro element as the vibrator element having a wide portion disposed at the tip of each of the adjusting vibrating arms. It should be noted that in FIG. 11, the same constituents as those of the gyro element 510 according to the third embodiment will be denoted with the same reference symbols, and the explanation thereof will be omitted, and further the graphic description thereof will also be omitted.

As shown in FIG. 11, a gyro element 501C according to the present modified example has the base section 1, the pair of driving vibrating arms 2a, 2b and the pair of detecting vibrating arms 3a, 3b respectively extending from the both end portions in the Y-axis direction of the base section 1, each having the same configuration as that of the gyro element 510 according to the third embodiment. Further, the gyro element 501C has an adjusting vibrating arm 15a adjacent to the detecting vibrating arm 3a in the −X direction, and extending from the base section 1 in the +Y direction, and an adjusting vibrating arm 15b adjacent to the detecting vibrating arm 3b in the +X direction, and extending from the base section 1 in the +Y direction. Further, in also the gyro element 501C, one adjusting vibrating arm 15a has the distance A with the adjacent detecting vibrating arm 3a, and the other adjusting vibrating arm 15b has the distance C with the adjacent detecting vibrating arm 3b. Further, the adjusting vibrating arms 15a, 15b and the detecting vibrating arms 3a, 3b are formed so that the relationship between the distance A, the distance C, the distance B between the pair of detecting vibrating arms 3a, 3b, and the thickness t of the base material satisfies the following.

$B<t$, $B\times 0.8 < A < B\times 1.2$, and $B\times 0.8 < C < B\times 1.2$

The adjusting electrodes 21c, 31c as film members for adjusting the leakage output of the gyro element 501C are disposed on the primary surfaces of the adjusting vibrating arms 15a, 15b, and the adjusting electrodes 22c, 32c are disposed on the side surfaces of the adjusting vibrating arms 15a, 15b, respectively.

On the tip side of the adjusting vibrating arms 15a, 15b, there are disposed weight sections 16a, 16b as the wide portions having a roughly rectangular shape with a larger width (greater length in the X-axis direction) than the adjusting vibrating arms 15a, 15b, respectively. On the surfaces of the weight sections 16a, 16b, there are disposed film members 40a, 40b, respectively. It should be noted that the film members can be disposed on the both primary surfaces of the weight sections 16a, 16b, and further the both side surfaces although the graphic description thereof is omitted. Further, the film members 40a, 40b can be formed of the same metal material as that of the other electrodes, or can be formed of a non-conductive material. Since the film members 40a, 40b can simultaneously be formed together with the other electrodes by forming the film members 40a, 40b with the same metal material as that of the other electrodes, the productivity can be enhanced. Further, by forming the film members 40a, 40b with the non-conductive material, the number of choices of the film member forming material is advantageously increased. It should be noted that the material with the density as high as possible (with the specific weight as great as possible) is preferably used as the film member forming material.

According to the gyro element 501C related to the modified example, since there are provided the adjusting vibrating arms 15a, 15b similarly to the adjusting vibrating arms 4a, 4b explained in the gyro element 510 according to the third embodiment, the gyro element 501C with the leakage vibration suppressed can be obtained. Further, since the weight sections 16a, 16b as the wide portions are disposed on the tip side of the respective adjusting vibrating arms 15a, 15b, it is possible to enhance the leakage vibration suppressing effect while preventing increase in the length of the adjusting vibrating arms 15a, 15b. Further, since there can be provided a wide adjustable range of the weight of the film members (the electrodes) provided to the adjusting vibrating arms 15a, 15b for suppressing the leakage vibration, a fine adjustment for suppressing the leakage vibration becomes possible, and thus, the gyro element 501C with higher sensitivity can be provided.

Gyro Element According to Fourth Embodiment

Figure 12:
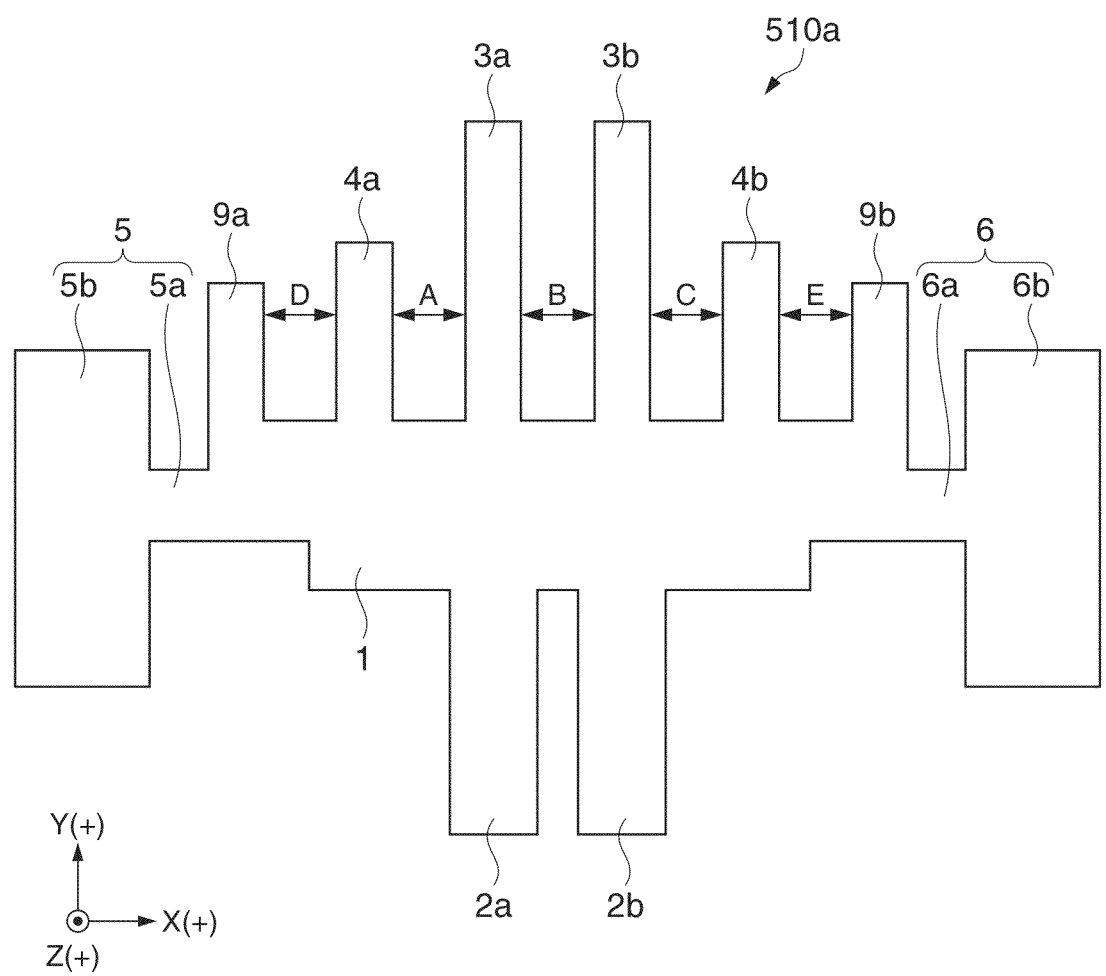
FIG. 12 is a schematic plan view showing a gyro element according to a fourth embodiment of the invention.

A gyro element according to a fourth embodiment will be explained along FIG. 12. FIG. 12 is a plan view schematically showing the gyro element according to the fourth embodiment. It should be noted that in the present explanation, constituents substantially the same as those of the gyro element 510 according to the third embodiment described above will be denoted with the same reference symbols, and the explanation thereof may be omitted or simplified.

As shown in FIG. 12, a gyro element 510a has a base section 1 integrally formed by processing a base material (a material constituting an essential part), driving vibrating arms 2a, 2b, detecting vibrating arms 3a, 3b, adjusting vibrating arms 4a, 4b, and balancing vibrating arms 9a, 9b. Further, a first support section 5 is formed of a first connection section 5a extending from the base section 1 and a first fixation section 5b connected to the first connection section 5a and to be fixed to a substrate such as a package not shown, and a second support section 6 is formed of a second connection section 6a extending from the base section 1 and a second fixation section 6b connected to the second connection section 6a and to be fixed to the substrate such as the package not shown.

Although in the gyro element 510a according to the present embodiment, quartz crystal with a thickness t is used as the base material, the explanation thereof will be omitted.

The gyro element 510a has the base section 1 having a roughly rectangular shape and located at a central portion, the pair of driving vibrating arms 2a, 2b extending in parallel to each other from one end portion in the Y-axis direction of the base section 1 along the Y axis, and the pair of detecting vibrating arms 3a, 3b extending in parallel to each other with a distance B from the other end portion of the base section 1 along the Y axis. Further, the gyro element 510a has the pair of adjusting vibrating arms 4a, 4b extending from the base section 1 in a direction intersecting with the crystal X axis (the electrical axis) of the quartz crystal in parallel to the detecting vibrating arms 3a, 3b so as to have the detecting vibrating arms 3a, 3b therebetween. In other words, the adjusting vibrating arms 4a, 4b extend along the Y axis in the +Y direction. Further, one adjusting vibrating arm 4a has a distance A with the adjacent detecting vibrating arm 3a, and the other adjusting vibrating arm 4b has a distance C with the adjacent detecting vibrating arm 3b.

Further, the gyro element 510a has the pair of balancing vibrating arms 9a, 9b extending from the base section 1 in a direction intersecting with the crystal X axis (the electrical axis) of the quartz crystal in parallel to the adjusting vibrating arms 4a, 4b so as to have the adjusting vibrating arms 4a, 4b therebetween. In other words, the balancing vibrating arms 9a, 9b extend along the Y axis in the +Y direction. Further, one balancing vibrating arm 9a has a distance D with the adjacent adjusting vibrating arm 4a, and the other balancing vibrating arm 9b has a distance E with the adjacent adjusting vibrating arm 4b.

Further, the adjusting vibrating arms 4a, 4b, the detecting vibrating arms 3a, 3b, and the balancing vibrating arms 9a, 9b are formed so that the relationship between the distance A, the distance C, the distance D, the distance E, the distance B between the pair of detecting vibrating arms 3a, 3b, and the thickness t of the base material satisfies the following.

$B < t,$ $B \times 0.8 < A < B \times 1.2,$ $B \times 0.8 < C < B \times 1.2,$ $A \times 0.8 < D < A \times 1.2,$ and $C \times 0.8 < E < C \times 1.2$ Further, the adjusting vibrating arms 4a, 4b are formed to have a length smaller than the lengths of the driving vibrating arms 2a, 2b and the detecting vibrating arms 3a, 3b. Further, the balancing vibrating arms 9a, 9b are formed to have a length smaller than the length of the adjusting vibrating arms 4a, 4b. Thus, since the vibration of the adjusting vibrating arms 4a, 4b for adjusting the leakage output and the vibration of the balancing vibrating arms 9a, 9b do not hinder the primary vibration of the gyro element 510a by the driving vibrating arms 2a, 2b and the detecting vibrating arms 3a, 3b, the vibration characteristics of the gyro element 510a are stabilized, and at the same time an advantageous effect to the miniaturization of the gyro element 510a can be obtained.

According to the gyro element 510a related to the fourth embodiment, since the balancing vibrating arms 9a, 9b are disposed with the distance D and the distance E from the adjusting vibrating arms 4a, 4b respectively in addition to the configuration of the gyro element 510 according to the third embodiment described above, it is possible to decrease the etching residues (fins) generated in the roots thereof in size to thereby stabilize the shape. Further, the balancing vibrating arms 9a, 9b function as a balancer, and it becomes possible to further suppress the vibration leakage output or the unwanted mode vibration (the TuX mode vibration). It should be noted that since the suppression of the vibration leakage output and the suppression of the unwanted mode vibration (the TuX mode vibration) are the same as in the first embodiment described above, the explanation thereof will be omitted here.

Figure 13:
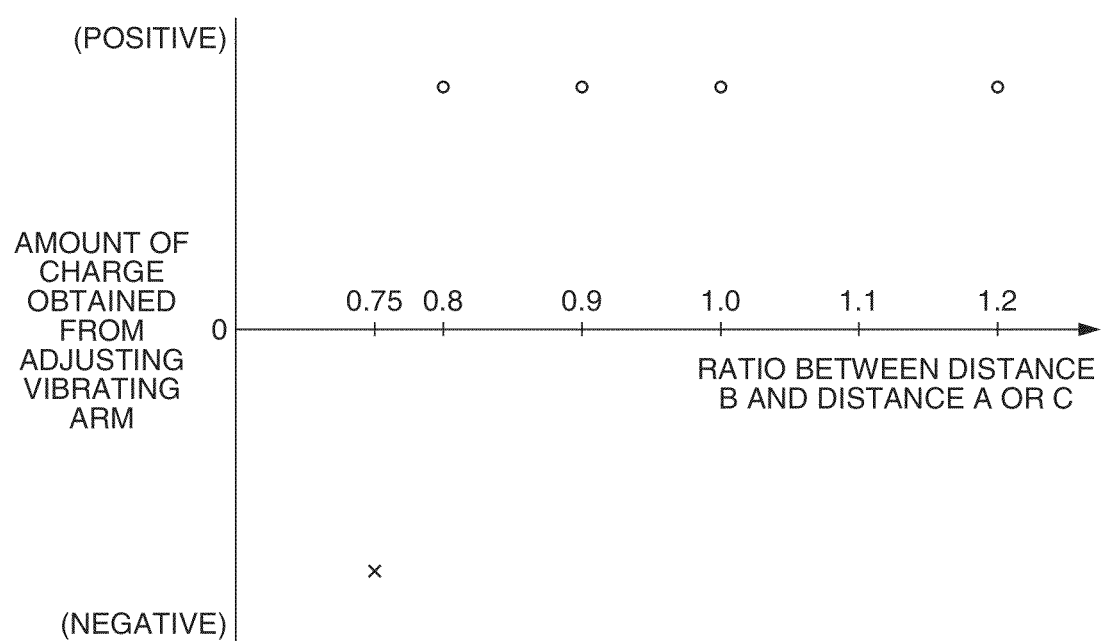
FIG. 13 is a graph showing a relationship between a distance between the vibrating arms and a charge amount obtained from the adjusting vibrating arms.

Further, FIG. 13 is a graph showing a relationship between the distance between the vibrating arms and an amount of the charge obtained from the adjusting vibrating arms in the gyro element 510 according to the third embodiment described above. The horizontal axis represents the dimensional ratio between the distance B between the pair of detecting vibrating arms 3a, 3b and the distance A between the one adjusting vibrating arm 4a and the adjacent detecting vibrating arm 3a, or the distance C between the other adjusting vibrating arm 4b and the adjacent detecting vibrating arm 3b when the relationship with the thickness t of the base material fulfills B<t. Further, the vertical axis represents the amount of the charge obtained from the adjusting vibrating arms.

As shown in the graph of FIG. 13, it is understood that if the ratio between the distance B and the distance A or the distance C exceeds 0.8, the amount of the charge obtained from the adjusting vibrating arms turns to positive, and the normal vibration mode is obtained. As described above, in the configuration in which the distance B, the distance A, and the distance C have the following relationship if the relationship between the distance B and the thickness t of the base material fulfills B<t, the suppression of the vibration leakage output or the suppression of the unwanted mode vibration (the TuX mode vibration) can be achieved.

$$B \times 0.8 < A < B \times 1.2, \text{ and}$$

$$B \times 0.8 < C < B \times 1.2$$

It should be noted that substantially the same advantage can be obtained even in the configuration having the shape of the fixation section 7 or 8 having a frame-like shape and connected to the base section 1 with the first connection section 5a and the second connection section 6a and having the first fixation section 5b and the second fixation section 6b as the gyro element 501A or the gyro element 501B explained with reference to FIGS. 10A and 10B.

It should be noted that since the configuration of the gyro sensor as the sensor unit using either one of the gyro elements 510, 501A, 501B, 501C, and 510a shown in the third and fourth embodiments, and the modified example thereof, the explanation of the leakage output of the gyro element, and the explanation of the unwanted mode vibration are the same as those of the gyro sensor 100 according to the second embodiment described above, the explanation thereof will be omitted here.

Further, after performing the suppression adjustment of the leakage output, the fine adjustment of the frequency of the gyro element 510 bonded to the package 110 is performed. The frequency adjustment can be performed by a method of decreasing the mass by partially removing the electrode of the gyro element 510 using laser trimming, a method of attaching the mass to the gyro element 510 using vapor deposition, sputtering, and so on, a method of rewriting the data of the semiconductor device 120, or the like.

Another Gyro Sensor

Figure 14A:
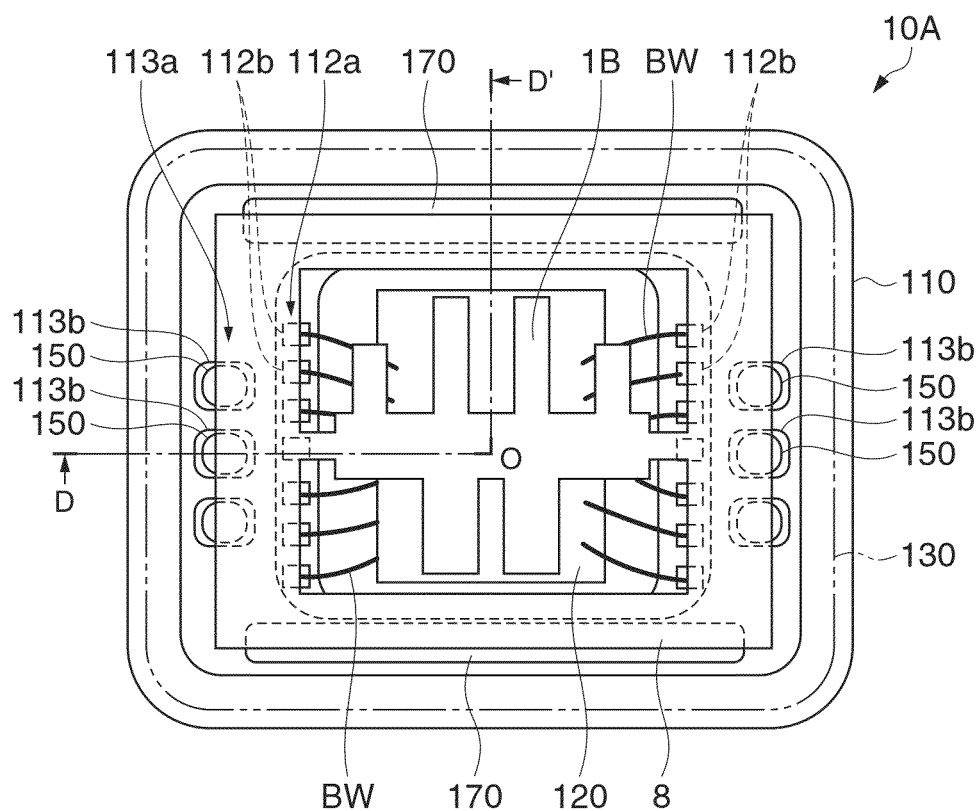
Figure 14B:
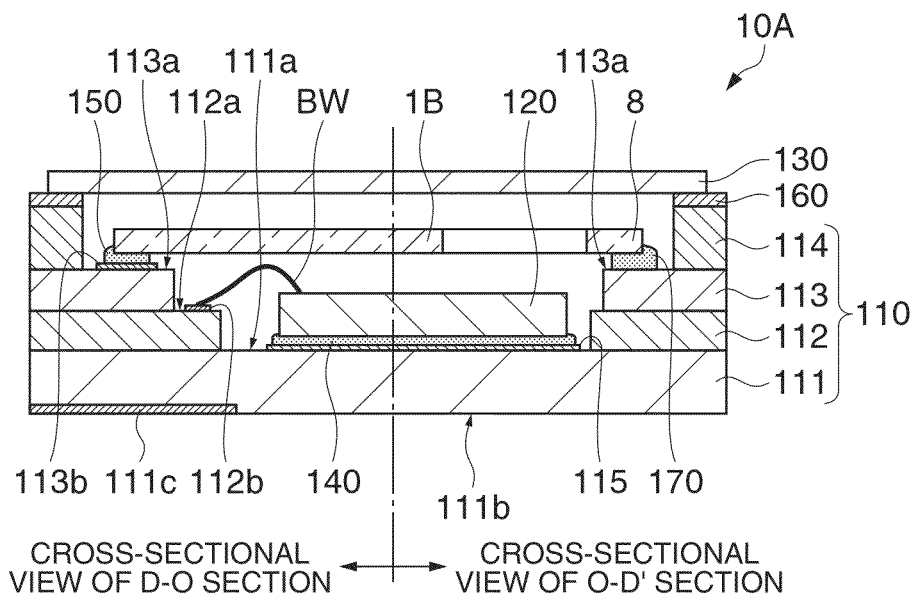

FIGS. 14A and 14B show a gyro sensor 10A housing the gyro element 1B shown in FIG. 3B as another gyro sensor, wherein FIG. 14A is a plan view and FIG. 14B is a cross-sectional view of the D-O-D' section shown in FIG. 14A. It should be noted that the same constituents as those of the gyro sensor 100 according to the second embodiment shown in FIGS. 5A and 5B are provided with the same reference symbols, and the explanation therefor will be omitted.

As shown in FIG. 14, the gyro element 1B is mounted on the third substrate surface 113a of the third substrate 113, and the fixation section 8 of the gyro element 1B is mounted thereon while aligning the positions of the connection pads 11f, 12f, 21h, 22f, 31h, and 32f (see FIGS. 2A through 2D) and the positions of the gyro element connection terminals 113b with each other, and is then fixed by bonding with the electrically-conductive adhesive 150. Further, the region of the fixation section 8 where the connection pads 11f, 12f, 21h, 22f, 31h, and 32f are not formed is fixed by bonding with an adhesive 170. As the adhesive 170, the electrically-conductive adhesive 150 used for the gyro element connection terminals 113b can also be used.

By forming the gyro sensor 10A using the gyro element 1B having the fixation section 8 with the frame-like shape, the gyro element 1B is fixed by bonding in the large area with the adhesive 170, and therefore, the gyro sensor with strong fixation force of the gyro element 1B to the package 110 can be obtained. Therefore, the leakage of the vibration of the driving vibrating arms 2a, 2b and the detecting vibrating arms 3a, 3b to the package 110 can further be suppressed.

It should be noted that in the present embodiment, the example using the gyro element 1B is explained, it is also possible to use the gyro element 501B explained in the third embodiment section, and substantially the same advantages can be obtained.

Fifth Embodiment

Figure 15A:
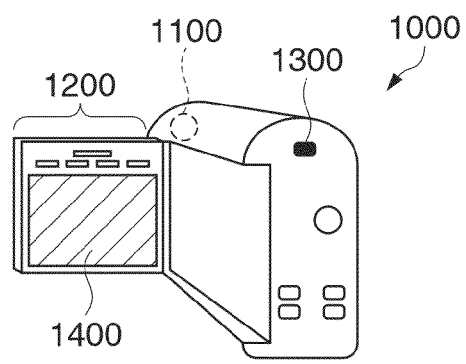
FIGS. 15A through 15C are external views showing electronic devices according to a fifth embodiment of the invention.
Figure 15B:
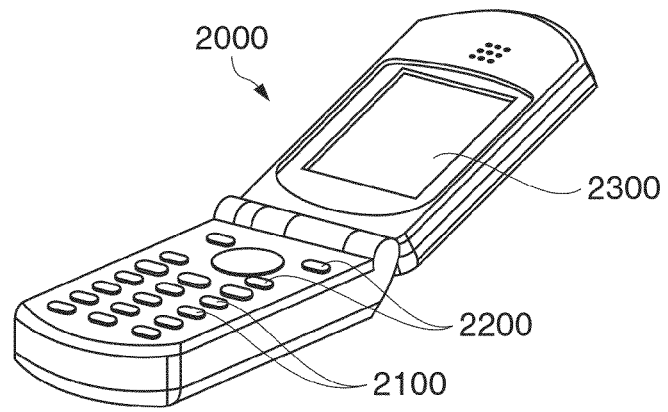
Figure 15C:
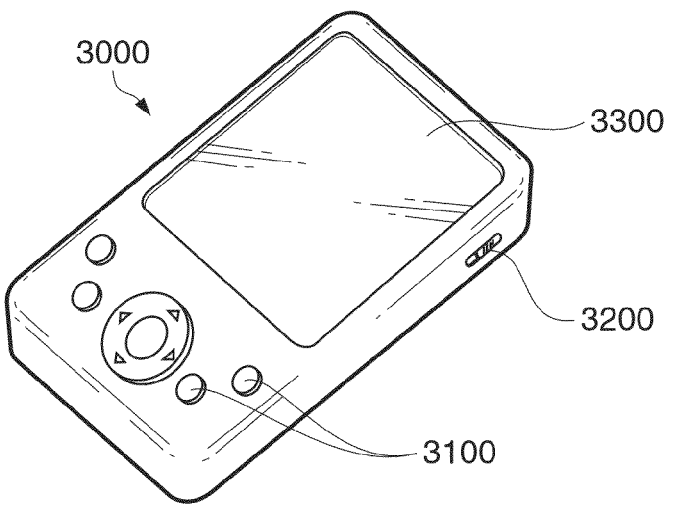

FIGS. 15A through 15C show external views of electronic devices each equipped with the gyro element 10 according to the first embodiment, the gyro element 510 according to the third embodiment, or one of the gyro elements 1A, 1B, 1C, 501A, 501B, 501C, and 510a. FIG. 15A shows a digital video camera 1000 equipped with one of the gyro elements 10, 510, or one of the gyro elements 1A, 1B, 1C, 501A, 501B, 501C, and 510a. The digital video camera 1000 is provided with an image reception section 1100, an operation section 1200, a sound input section 1300, and a display unit 1400. It is possible to provide such a digital video camera 1000 with an image stabilization function by equipping any of the gyro elements 10, 510, 1A, 1B, 1C, 501A, 501B, 501C, and 510a according to the embodiments described above, or any of the gyro sensors 100, 10A as the sensor unit to the digital video camera 1000.

FIG. 15B shows an application example to a cellular phone as the electronic device, and FIG. 15C shows an application example to a personal digital assistants (PDA). A cellular phone 2000 shown in FIG. 15B is provided with a plurality of operation buttons 2100 and scroll buttons 2200, and a display unit 2300. By operating the scroll buttons 2200, a screen displayed on the display unit 2300 is scrolled. A PDA 3000 shown in FIG. 15C is provided with a plurality of operation buttons 3100, a power switch 3200, and a display unit 3300. When operating the power switch 3200, various kinds of information such as an address list or a date book are displayed on the display unit 3300.

It is possible to provide such cellular phone 2000 and PDA 3000 with a variety of functions by installing one of the gyro elements 10, 510, 1A, 1B, 1C, 501A, 501B, 501C, and 510a according to the embodiments described above, or one of the gyro sensors 100, 10A as the sensor unit. For example, in the case of providing the cellular phone 2000 shown in FIG. 15B with a camera function not shown, it is possible to perform the image stabilization similarly to the digital video camera 1000 described above. Further, in the case of providing the cellular phone 2000 shown in FIG. 15B or the PDA 3000 shown in FIG. 15C with a global positioning system (GPS) widely known to the public, the position and the posture of the cellular phone 2000 or the PDA 3000 can be made to be recognized using the GPS by installing one of the gyro elements 10, 510, 1A, 1B, 1C, 501A, 501B, 501C, and 510a according to the embodiments described above, or one of the gyro sensors 100, 10A as the sensor unit.

It should be noted that as the electronic device to which the sensor unit (the gyro sensor) provided with the vibrator element according to the invention can be applied, there can be cited a mobile computer, a car navigation system, an electronic organizer, a calculator, a workstation, a video phone, a POS terminal, a gaming machine, and so on besides the electronic devices shown in FIGS. 15A through 15C.

Although the embodiments of the invention are hereinabove explained specifically, the invention is not limited to the embodiments described above, but can variously be modified within the scope or the spirit of the invention. For example, although the example using quartz crystal as the forming material of the gyro element as the vibrator element is explained in the embodiments and the modified examples described above, a piezoelectric material other than quartz crystal can also be used. For example, there can be used aluminum nitride (AlN), an oxide substrate such as lithium niobate (LiNbO$_3$), lithium tantalate (LiTaO$_3$), lead zirconium titanate (PZT), lithium tetraborate (Li$_2$B$_4$O$_7$), or langasite (La$_3$Ga$_5$SiO$_{14}$), a multilayer piezoelectric substrate formed by stacking a piezoelectric material such as aluminum nitride or tantalum pentoxide (Ta$_2$O$_5$) on a glass substrate, or piezoelectric ceramics. Further, the vibrator element can be formed using a material other than the piezoelectric material. The vibrator element can be formed using, for example, a silicon semiconductor material. Further, the vibration (drive) system of the vibrator element is not limited to the piezoelectric drive system. The configuration of the invention and the advantages thereof can be exerted in the vibrator element of an electrostatic actuator type using an electrostatic force, or a Lorentz drive type using a magnetic force besides the vibrator element of the piezoelectric drive type using the piezoelectric substrate.

Further, in the modified examples described above, there is explained the example of disposing the weight sections 16a, 16b as the wide portions at the tips on the free end side of the adjusting vibrating arms 15a, 15b as the second vibrating arms to thereby broaden the range of the adjustment for suppressing the leakage output. Besides the above, by disposing the weight sections as the wide portions at the tips on the free end side of the driving vibrating arms or the detecting vibrating arms as the first vibrating arms, it is possible to lower the resonant frequency while preventing the increase in outer size of the vibrator element (the gyro element) to thereby achieve the miniaturization and the higher sensitivity.

The entire disclosure of Japanese Patent Application Nos. 2012-029180, filed Feb. 14, 2012 and 2012-052622, filed Mar. 9, 2012 are expressly incorporated by reference herein.

What is claimed is:

1. A vibrator element comprising:
   a base section;
   a driving vibrating arm extending from one end of the base section;
   a detecting vibrating arm extending from another end of the base section opposite to the one end;
   an adjusting vibrating arm extending from the base section in a direction opposite to a direction in which the driving vibrating arm extends; and
   a support section extending from the base section in a first direction and fixed to a substrate,
   wherein an output signal of the adjusting vibrating arm has a reverse phase with respect to an output signal of a leakage vibration of the detecting vibrating arm,
   wherein the base section has a first width along a second direction perpendicular to the first direction of the support section, and
   wherein the support section has a second width along the second direction between the substrate and the base section, and the second width is smaller than the first width.

2. The vibrator element according to claim 1, wherein the driving vibrating arm is a pair of driving vibrating arms, the detecting vibrating arm is a pair of detecting vibrating arms, and
the adjusting vibrating arm is a pair of adjusting vibrating arms disposed so that the pair of detecting vibrating arms are located between the pair of adjusting vibrating arms.

3. The vibrator element according to claim 1, wherein the support section includes
   a first connection section and a second connection section each having one end connected to the base section,
   a first fixation section connected to another end of the first connection section, and
   a second fixation section connected to another end of the second connection section.

4. The vibrator element according to claim 3, wherein the first fixation section and the second fixation section are connected to each other.

5. The vibrator element according to claim 1, wherein the detecting vibrating arm is provided with a detection electrode,
the adjusting vibrating arm is provided with a metal film, and
the metal film and the detection electrode are electrically connected to each other.

6. The vibrator element according to claim 1, wherein a wide portion is disposed at a tip portion of the adjusting vibrating arm on an opposite side to a side of the base section.

7. The vibrator element according to claim 1, wherein a length of the adjusting vibrating arm is shorter than a length of the driving vibrating arm and a length of the detecting vibrating arm.

8. A sensor unit comprising:
   the vibrator element according to claim 1;
   an electronic component including
      a drive circuit adapted to excite the driving vibrating arm, and
      a detection circuit adapted to detect a detection signal generated in the detecting vibrating arm; and
   a package housing the vibrator element and the electronic component.

9. An electronic device comprising:
   the vibrator element according to claim 1.

10. A vibrator element formed of a base material having a thickness t, comprising:
    a base section;
    first and second detecting vibrating arms extending from one end of the base section;
    first and second driving vibrating arms extending from another end of the base section opposite to the one end; and
    first and second adjusting vibrating arms extending from either one of the one end and the other end, and disposed so that either one of the first and second detecting vibrating arms and the first and second driving vibrating arms is located between the adjusting vibrating arms,
    wherein a relationship between
       the thickness t,
       a distance B between a pair of arms of the first and second detecting vibrating arms or the first and second driving vibrating arms,
       a distance A between one of the first and second adjusting vibrating arms and one of the first and second detecting vibrating arms or the first and second driving vibrating arms adjacent to the one of the first and second adjusting vibrating arms, and a distance C between the other of the first and second adjusting vibrating arms and the other of the first and second detecting vibrating arms or the first and second driving vibrating arms adjacent to the other of the first and second adjusting vibrating arms is as follows:

$B<t,$ $B\times 0.8<A<B\times 1.2,$ and $B\times 0.8<C<B\times 1.2.$

11. The vibrator element according to claim 10, further comprising:
first and second balancing vibrating arms disposed so that the first and second adjusting vibrating arms are located between the first and second balancing vibrating arms,
wherein a relationship between
a distance D between one of the first and second balancing vibrating arms and one of the first and second adjusting vibrating arms adjacent to the one of the first and second balancing vibrating arms, and
a distance E between the other of the first and second balancing vibrating arms and the other of the first and second adjusting vibrating arms adjacent to the other of the first and second balancing vibrating arms is as follows:

$A\times 0.8<D<A\times 1.2,$ and $C\times 0.8<E<C\times 1.2.$

12. The vibrator element according to claim 10, wherein
the first and second detecting vibrating arms are each provided with a detecting electrode,
the first and second adjusting vibrating arms are each provided with a metal film, and
the metal film and the detecting electrode are electrically connected to each other.

13. The vibrator element according to claim 10, wherein
a wide portion is disposed at a tip portion of each of the first and second adjusting vibrating arms on an opposite side to a side of the base section.

14. The vibrator element according to claim 10, wherein
a length of the first and second adjusting vibrating arms is shorter than a length of the first and second driving vibrating arms and a length of the first and second detecting vibrating arms.

15. A sensor unit comprising:
the vibrator element according to claim 10;
an electronic component including
a drive circuit adapted to excite the first and second driving vibrating arms, and
a detection circuit adapted to detect a detection signal generated in the first and second detecting vibrating arms; and
a package housing the vibrator element and the electronic component.

16. An electronic device comprising:
the vibrator element according to claim 10.

* * * * *